(12) United States Patent
Park

(10) Patent No.: US 11,024,830 B2
(45) Date of Patent: Jun. 1, 2021

(54) DISPLAY DEVICE

(71) Applicant: SAMSUNG DISPLAY CO., LTD., Yongin-si (KR)

(72) Inventor: Jung Mok Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/376,015

(22) Filed: Apr. 5, 2019

(65) Prior Publication Data

US 2019/0363297 A1 Nov. 28, 2019

(30) Foreign Application Priority Data

May 28, 2018 (KR) .......................... 10-2018-0060650

(51) Int. Cl.
*G06F 3/042* (2006.01)
*H01L 51/52* (2006.01)
*H01L 27/32* (2006.01)

(52) U.S. Cl.
CPC ........ *H01L 51/5262* (2013.01); *G06F 3/0421* (2013.01); *H01L 27/323* (2013.01)

(58) Field of Classification Search
CPC . H01L 27/323; H01L 51/5262; G06F 3/0421; G06F 3/0443
See application file for complete search history.

(56) References Cited

U.S. PATENT DOCUMENTS

| 2018/0039471 A1* | 2/2018 | Yanagisawa | .............. G06F 3/14 |
| 2018/0090702 A1* | 3/2018 | Um | ..................... H01L 51/0097 |
| 2018/0260602 A1* | 9/2018 | He | ........................ G06K 9/0008 |
| 2019/0056821 A1* | 2/2019 | Choi | ....................... G06F 3/044 |
| 2019/0243506 A1* | 8/2019 | Yoon | ................... G02F 1/13338 |

FOREIGN PATENT DOCUMENTS

KR  10-2001-0094773  11/2001

* cited by examiner

*Primary Examiner* — Abbas I Abdulselam
(74) *Attorney, Agent, or Firm* — F. Chau & Associates, LLC

(57) ABSTRACT

A display device includes: a display panel; and a touch member disposed on the display panel. The touch member includes a first conductive layer and a first insulating layer. The first insulating layer is disposed on the first conductive layer and includes diffraction patterns.

20 Claims, 21 Drawing Sheets

DISPLAY DEVICE

CROSS-REFERENCE TO RELATED APPLICATION

This application claims priority under 35 U.S.C. § 119 to Korean Patent Application No. 10-2018-0060650, filed on May 28, 2018, in the Korean Intellectual Property Office, the disclosure of which is incorporated by reference herein in its entirety.

TECHNICAL FIELD

The present invention relates to a display device, and more particularly, to a display device including a touch member with diffraction patterns.

DISCUSSION OF THE RELATED ART

With the development of multimedia, display devices with high resolution display panels have become increasingly desired. Accordingly, various types of display devices such as liquid crystal displays (LCDs) and organic light emitting displays (OLEDs) are being used.

Of these display devices, OLEDs display an image using an organic light emitting element that generates light through recombination of electrons and holes in an emission layer of the OLED. Such OLEDs have a fast response speed, a high luminance, a wide viewing angle, and a low power consumption.

A head-mounted display device may be mounted on a user's bead and may be in the form of glasses or a helmet. The head-mounted display device allows the user to recognize an image by displaying the image in front of the user's eyes.

SUMMARY

According to an exemplary embodiment of the present invention, a display device includes: a display panel; and a touch member disposed on the display panel. The touch member includes a first conductive layer and a first insulating layer. The first insulating layer is disposed on the first conductive layer and includes diffraction patterns.

In an exemplary embodiment of the present invention, the first conductive layer includes a plurality of first sensor electrodes and a plurality of second sensor electrodes separated from each of the first sensor electrodes.

In an exemplary embodiment of the present invention, the diffraction patterns include a plurality of insulating diffraction patterns disposed on the first sensor electrodes and the second sensor electrodes.

In an exemplary embodiment of the present invention, the first conductive layer further includes a second connection electrode connecting adjacent second sensor electrodes.

In an exemplary embodiment of the present invention, the display device further includes a second conductive layer disposed on the first insulating layer and including a first connection electrode connecting adjacent first sensor electrodes.

In an exemplary embodiment of the present invention, the first insulating layer further includes an insulating pattern disposed between the first connection electrode and the second connection electrode and separated from the insulating diffraction patterns.

In an exemplary embodiment of the present invention, the insulating diffraction patterns are disposed between the first sensor electrodes and the second electrodes.

In an exemplary embodiment of the present invention, the insulating diffraction patterns have a substantially constant size and are arranged at substantially constant intervals.

In an exemplary embodiment of the present invention, the first conductive layer includes a transparent conductive material, and the second conductive layer includes an opaque conductive material.

In an exemplary embodiment of the present invention, the first insulating layer includes a plurality of insulating diffraction holes exposing the first sensor electrodes and the second sensor electrodes, and penetrating the first insulating layer in a thickness direction, wherein the plurality of insulating diffraction holes form the diffraction patterns.

In an exemplary embodiment of the present invention, the display device further includes a second conductive layer which is disposed on the first insulating layer and includes a first connection electrode connecting adjacent first sensor electrodes. The first conductive layer further includes a second connection electrode connecting adjacent second sensor electrodes.

In an exemplary embodiment of the present invention, the first insulating layer includes recesses and protrusions, wherein the recesses and protrusions are disposed on the first sensor electrodes and the second sensor electrodes, wherein the recesses and protrusions form the diffraction patterns.

In an exemplary embodiment of the present invention, the display device further includes a second conductive layer and a second insulating layer. The second insulating layer is disposed between the first conductive layer and the first insulating layer. The second conductive layer is disposed between the second insulating layer and the first insulating layer. The first conductive layer further includes a second connection electrode connecting adjacent second sensor electrodes. The second conductive layer includes a first connection electrode connecting adjacent first sensor electrodes. The second insulating layer includes an insulating pattern disposed between the first connection electrode and the second connection electrode.

According to an exemplary embodiment of the present invention, a display device includes: a display panel; and a touch member disposed on the display panel. The touch member includes a first conductive layer including diffraction patterns and an insulating layer stacked on the first conductive layer.

In an exemplary embodiment of the present invention, the first conductive layer includes a plurality of first sensor electrodes and a plurality of second sensor electrodes separated from each of the first sensor electrodes. The first sensor electrodes and the second sensor electrodes include a plurality of conductive diffraction holes penetrating the first sensor electrodes and the second sensor electrodes in a thickness direction.

In an exemplary embodiment of the present invention, the display device further includes a second conductive layer disposed on the insulating layer and including a first connection electrode connecting adjacent first sensor electrodes. The first conductive layer further includes a second connection electrode connecting adjacent second sensor electrodes.

In an exemplary embodiment of the present invention, the insulating layer includes an insulating pattern disposed between the first connection electrode and the second connection electrode.

In an exemplary embodiment of the present invention, the display device further includes a second conductive layer disposed below the first conductive layer and including a plurality of first sensor electrodes and a plurality of second sensor electrodes separated from each of the first sensor electrodes.

In an exemplary embodiment of the present invention, the first conductive layer includes a plurality of conductive diffraction patterns disposed on the first sensor electrodes and the second sensor electrodes.

In an exemplary embodiment of the present invention, the first conductive layer further includes a first connection electrode connecting adjacent first sensor electrodes. The second conductive layer further includes a second connection electrode connecting adjacent second sensor electrodes. The insulating layer is disposed between the first connection electrode and the second connection electrode.

BRIEF DESCRIPTION OF THE DRAWINGS

The above and other features of the present invention will become more apparent by describing in detail exemplary embodiments thereof, with reference to the accompanying drawings, in which:

FIG. 5 is a schematic view illustrating an optical path of the display device to which FIG. 4 is applied according to an exemplary embodiment of the present invention;

FIG. 8 is a cross-sectional view of a display device to which FIG. 7 is applied according to an exemplary embodiment of the present invention;

FIG. 10 is a cross-sectional view of a display device to which FIG. 9 is applied according to an exemplary embodiment of the present invention;

FIG. 12 is a cross-sectional view of a display device to which FIG. 11 is applied according to an exemplary embodiment of the present invention;

FIG. 14 is a cross-sectional view of a display device to which FIG. 13 is applied according to an exemplary embodiment of the present invention;

FIG. 16 is a cross-sectional view of a display device to which FIG. 15 is applied according to an exemplary embodiment of the present invention;

FIG. 18 is a cross-sectional view of a display device to which FIG. 17 is applied according to an exemplary embodiment of the present invention;

FIG. 20 is a cross-sectional view of a display device to which FIG. 19 is applied.

DETAILED DESCRIPTION OF THE EMBODIMENTS

Figure 1:
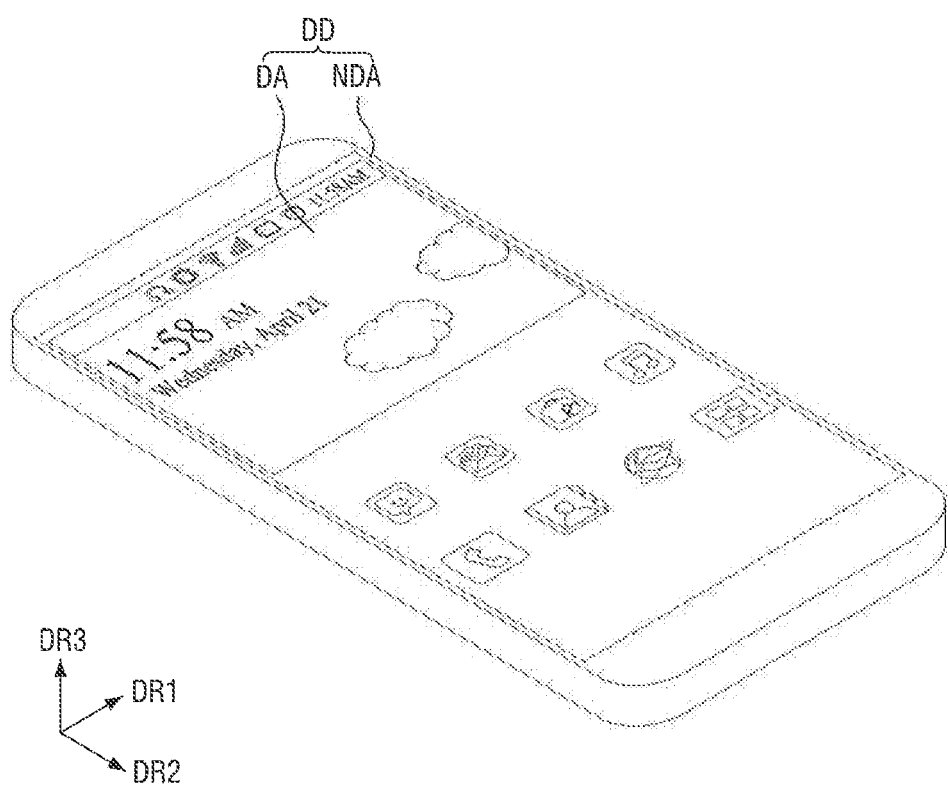
FIG. 1 is a perspective view of a display device according to an exemplary embodiment of the present invention.

Exemplary embodiments of the present invention will be described more fully hereinafter with reference to the accompanying drawings. However, the present invention is not limited to the exemplary embodiments disclosed hereinafter, but can be implemented in diverse forms.

Where an element is described as being "on" another element, the element may be directly on another element or intervening elements may be present.

Throughout the specification, the same reference numerals may denote the same or similar elements or features, and thus their descriptions may be omitted.

FIG. 1 is a perspective view of a display device according to an exemplary embodiment of the present invention.

The display device is a device for displaying images. For example, the display device may display moving or still images. The display device may be used in portable electronic devices such as a mobile phone, a smartphone, a tablet personal computer (PC), a virtual reality (VR) device, a smart watch, a watch phone, a mobile communication terminal, an electronic notebook, an electronic book, a portable multimedia player (PMP), a navigation system and a ultra-mobile PC (UMPC), as well as in various products such as a television, a notebook computer, a monitor, a billboard and the Internet of things.

Referring to FIG. 1, the display device includes at least one display surface DD. The display device may have a three-dimensional shape including a plurality of surfaces, and the display surface DD may be disposed on at least one of the surfaces of the display device. For example, the display device may be shaped like a three-dimensional rectangular parallelepiped, and the display surface DD may be disposed on at least one of the surfaces of the rectangular parallelepiped. As an additional example, in FIG. 1, the display surface DD may be disposed on an upper surface of the rectangular parallelepiped. Although the display surface DD is disposed only on an upper surface of the rectangular parallelepiped in the drawing, the present invention is not limited to this case, and the display surface DD may also be disposed on at least one side surface of the rectangular parallelepiped. For example, the display surface DD may be curved around at least one side surface of the rectangular parallelepiped. In another example, the display device may be included in glasses or a helmet (e.g., in a visor of a helmet). As an additional example, the display device may have a cylindrical shape.

In an exemplary embodiment of the present invention, the display device may be a curved display device including a curved surface. For example, at least one edge of the display device may include a surface curved in a thickness direction (e.g., a direction perpendicular to a lower surface of the display device). The curved surface may be, but is not limited to, the display surface DD.

The display surface DD may include a display area DA where an image is displayed and a non-display area NDA disposed around the display area DA. For example, the non-display area NDA may at least partially surround the display are DA. In FIG. 1, icon images are illustrated as an example of the image that may be displayed in the display area DA.

The display area DA may have a quadrilateral shape. The non-display area NDA may be disposed adjacent to at least one side of the display area DA. For example, when the display area DA is rectangular, the non-display area NDA may be disposed adjacent to both short sides of the display area DA. In addition, the non-display area NDA may be disposed adjacent to both long sides of the display area DA or may surround all sides of the display area DA.

Figure 2:
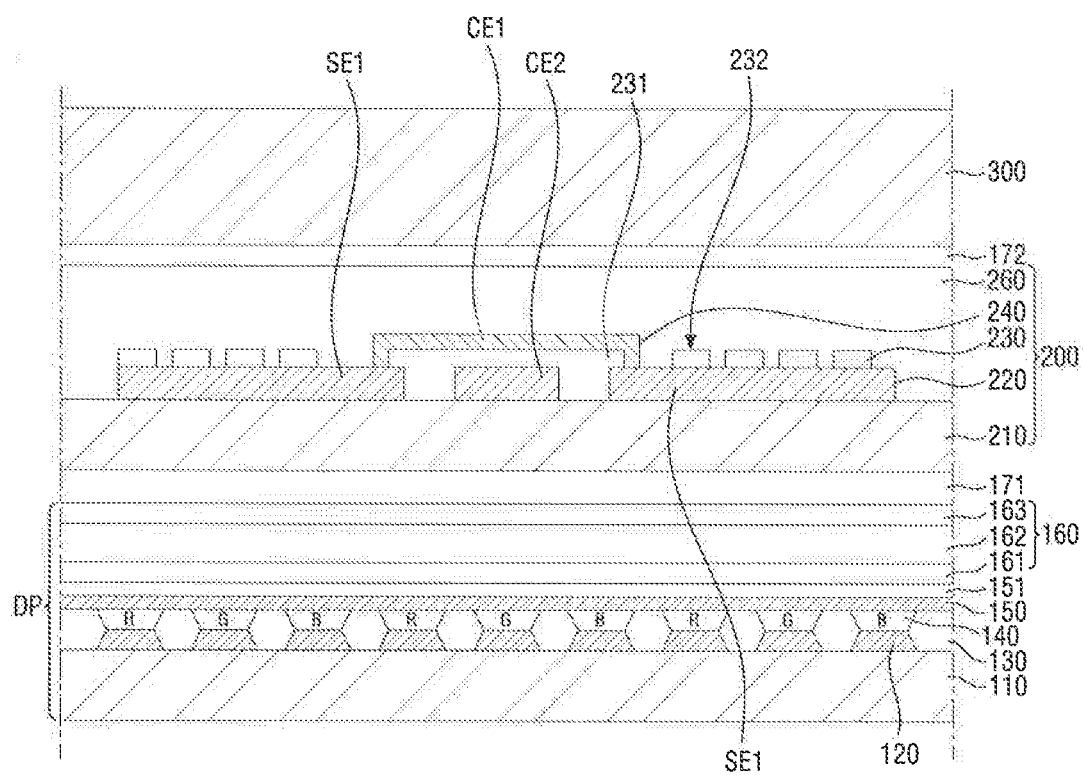
FIG. 2 is a cross-sectional view of the display device according to an exemplary embodiment of the present invention.

FIG. 2 is a cross-sectional view of the display device according to the exemplary embodiment of the present invention.

Referring to FIG. 2, the display device may include a display panel DP, a touch member 200, and a window member 300.

The display panel DP may be, for example, an organic light emitting display panel. Organic light emitting display panels may be divided into a top emission type, a bottom emission type, and a double-sided emission type according to a light emitting direction. In exemplary embodiments of the present invention, an organic light emitting display panel, for example, a top emission organic light emitting display panel will be described as an example of the display panel DP. However, other types of display panels such as a liquid crystal display (LCD) panel, a field emission display (FED) panel, and an electrophoresis device may also be applied.

The display panel DP may include a first substrate 110 and a plurality of pixel electrodes 120, a pixel defining layer 130, a plurality of organic light emitting layers 140, a common electrode 150, a capping layer 151 and a thin-film encapsulation layer 160 disposed on the first substrate 110.

The first substrate 110 may be, for example, an insulating substrate. In an exemplary embodiment of the present invention, the first substrate 110 may be made of a material such as glass, quartz, or polymer resin. Here, the polymer material may be polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of these materials. In an exemplary embodiment of the present invention, the first substrate 110 may be a flexible substrate including polyimide (PI).

The pixel electrodes 120 are disposed on the first substrate 110 in a plurality of pixels, respectively. Each of the pixel electrodes 120 may be an anode electrode of an organic light emitting element. Although not illustrated in the drawing, a plurality of elements may be further disposed between the first substrate 110 and the pixel electrodes 120. For example, a buffer layer, a plurality of conductive wirings, an insulating layer, and a plurality of thin-film transistors may be disposed between the first substrate 110 and the pixel electrodes 120.

The pixel electrodes 120 may include a conductive material having a relatively high work function compared with the common electrode 150. For example, the pixel electrodes 120 may include, for example, indium tin oxide (ITO), indium zinc oxide (IZO), zinc oxide (ZnO), and/or indium oxide ($In_2O_3$). When the display device is a top emission display device, the pixel electrodes 120 may further include silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), and/or a mixture of these materials. For example, the pixel electrodes 120 may have a multilayer structure of ITO/Mg, ITO/MgF, ITO/Ag, and/or ITO/Ag/ITO.

The pixel defining layer 130 may be disposed on the pixel electrodes 120. The pixel defining layer 130 includes openings, each exposing at least part of a corresponding pixel electrode 120. The pixel defining layer 130 may include an organic material or an inorganic material. In an exemplary embodiment of the present invention, the pixel defining layer 130 may include a material such as photoresist, polyimide resin, acrylic resin, a silicon compound, and/or polyacrylic resin.

The organic light emitting layers 140 may be respectively disposed in the openings exposed by the pixel defining layer 130. Each of the organic light emitting layers 140 may emit one of, e.g., red light, green light, and blue light. A wavelength of the red light may be about 620 nm to about 750 nm, and a wavelength of the green light may be about 495 nm to about 570 nm. In addition, a wavelength of the blue light may be about 450 nm to about 495 nm.

In an exemplary embodiment of the present invention, each of the organic light emitting layers 140 may emit white light. When each of the organic light emitting layers 140 emits white light, it may have a stacked structure of organic light emitting materials emitting different colors. For example, each of the organic light emitting layers 140 may have a stacked structure of a red organic light emitting material layer, a green organic light emitting material layer, and/or a blue light emitting material layer. In this case, the display panel DP may further include color filters for displaying red, green, and blue colors.

Although not illustrated in the drawing, the display panel DP may include a hole injection layer (HIL) and/or a hole transport layer (HTL) between each of the organic light emitting layers 140 and each of the pixel electrodes 120 and may further include an electron transport layer (ETL) and/or an electron injection layer (EIL) between each of the organic light emitting layers 140 and the common electrode 150.

The common electrode 150 may be disposed on the organic light emitting layers 140 and the pixel defining layer 130. The common electrode 150 may be formed entirely on the organic light emitting layers 140 and the pixel defining layer 130 in an exemplary embodiment of the present invention. The common electrode 150 may include a conductive material having a low work function. For example, the common electrode 150 may include Li, Ca, LiF/Ca, LiF/Al, Al, Mg, Ag, Pt, Pd, Ni, Au Nd, Ir, Cr, BaF, Ba, and/or a compound or mixture of these materials (e.g., a mixture of Ag and Mg). When the display device is a top emission display device, the above-mentioned conductive materials having a low work function may be formed as a thin layer of the common electrode 150. The common electrode 150 may further include a transparent conductive layer disposed on the thin conductive material layer having a low work function. The transparent conductive layer may include indium tin oxide (ITO), indium zinc oxide (IZO), zinc oxide (ZnO), and/or indium tin zinc oxide.

The capping layer 151 may be disposed on the common electrode 150. The capping layer 151 may prevent light incident on the common electrode 150 from being lost by a reflection. The capping layer 151 may be formed as an organic layer or an inorganic layer.

The thin-film encapsulation layer 160 is disposed on the common electrode 150. The thin-film encapsulation layer 160 may cover the organic light emitting layers 140. The thin-film encapsulation layer 160 may be a layer in which an inorganic layer and an organic layer are alternately stacked. For example, the thin-film encapsulation layer 160 may include a first inorganic layer 161, an organic layer 162, and a second inorganic layer 163 stacked sequentially.

The touch member 200 is disposed on the display panel DP. The touch member 200 may be attached onto the thin-film encapsulation layer 160 of the display panel DP by a first adhesive member 171. The first adhesive member 171 may be, for example, an optical clear adhesive (OCA) or an optical clear resin (OCR).

The touch member 200 may include a plurality of touch electrodes and an insulating layer 230.

For example, the touch member 200 may include a second substrate 210, a first conductive layer 220 disposed on the second substrate 210, the insulating layer 230 disposed on the first conductive layer 220, and a second conductive layer 240 disposed on the insulating layer 230.

The second substrate 210 may include a material such as glass, quartz, or a polymer resin. In an exemplary embodiment of the present invention, the second substrate 210 may be made of substantially the same material as the first substrate 110 described above.

The first conductive layer 220 is disposed on the second substrate 210. For example, the first conductive layer 220 may be disposed directly on the second substrate 210. The first conductive layer 220 may include a plurality of first sensor electrodes SE1, a plurality of second sensor electrodes SE2 (see. e.g. FIG. 3), and a second connection electrode CE2 connecting adjacent second sensor electrodes SE2 (see, e.g., FIGS. 3 and 4).

The first conductive layer 220 may include transparent conductive oxide such as indium tin oxide (ITO), indium zinc oxide (IZO), zinc oxide (ZnO), and/or indium tin zinc oxide (ITZO).

The insulating layer 230 may include an insulating pattern 231 and a plurality of diffraction patterns 232. For example, the diffraction patterns 232 may be insulating diffraction patterns.

The insulating pattern 231 covers the second connection electrode CE2. A first connection electrode CE1 connecting adjacent first sensor electrodes SE1 is disposed on the insulating pattern 231. The first connection electrode CE1 may be electrically insulated from the second connection electrode CE2 by the insulating pattern 231. The insulating pattern 231 may partially cover upper surfaces of the first sensor electrodes SE1 and the second sensor electrodes SE2.

Figure 4:
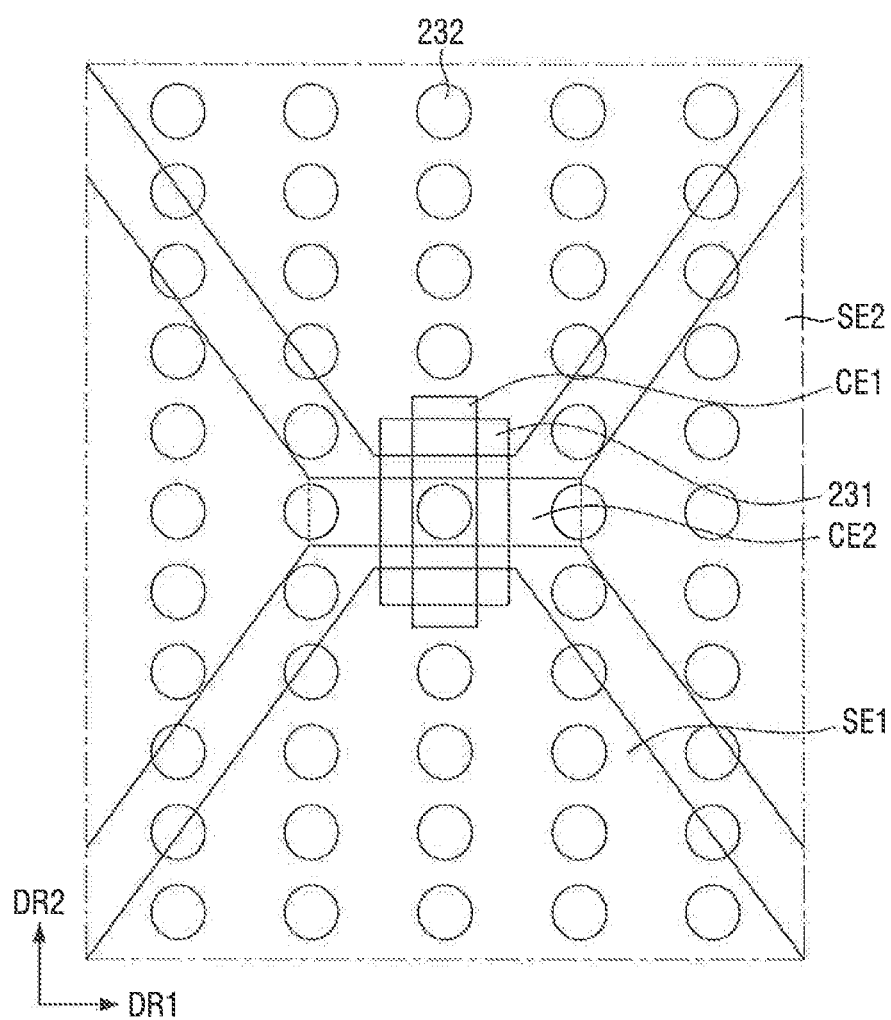
FIG. 4 is an enlarged layout view of a region A of the touch member illustrated in FIG. 3 according to an exemplary embodiment of the present invention.

The diffraction patterns 232 are disposed on the first sensor electrodes SE1 and the second sensor electrodes SE2 (see, e.g. FIG. 4). Although not illustrated in FIG. 2, the diffraction patterns 232 may be disposed in spaces between the first and second sensor electrodes SE1 and SE2. The diffraction patterns 232 may be disposed in the entire region excluding a portion where the insulating pattern 231 is disposed.

The diffraction patterns 232 may diffract light emitted from the organic light emitting layers 140 to increase an emission area. The diffraction patterns 232 will be described in detail later.

The insulating layer 230 may have a single layer structure or a multilayer structure. The insulating layer 230 may include an inorganic material, an organic material, and/or a composite material. When the insulating layer 230 includes an inorganic material, the inorganic material may include at least one of aluminum oxide, titanium oxide, silicon oxide, silicon oxynitride, zirconium oxide, and/or hafnium oxide. When the insulating layer 230 includes an organic material, the organic material may include at least one of acrylic resin, methacrylic resin, polyisoprene, vinyl resin, epoxy resin, urethane resin, cellulose resin, siloxane resin, polyimide resin, polyamide resin, and/or perylene resin.

The second conductive layer 240 may be disposed on the insulating pattern 231. The second conductive layer 240 may include the first connection electrode CE1 electrically connecting adjacent first sensor electrodes SE1. The first connection electrode CE1 may be disposed on an upper surface of the insulating pattern 231 and extend to side surfaces of the insulating pattern 231. The first connection electrode CE1 may electrically contact the first sensor electrodes SE1 exposed by the side surfaces of the insulating pattern 231. For example, side portions of the first connection electrode CE1 may overlap the side surfaces of the insulating pattern 231 to be electrically connected to the first sensor electrodes SE1.

For example, the first connection electrode CE1 may extend to outside the insulating pattern 231 and at least partially overlap the first sensor electrodes SE1 to be electrically connected to the first sensor electrodes SE1. For example, the first connection electrode CE1 may extend beyond an upper surface of the insulating pattern 231. For example, the first connection electrode CE1 may be disposed directly on the insulating pattern 231 surrounding a region including a region (e.g., upper surface) of the second connection electrode CE2 which overlaps the first connection electrode CE1 in the thickness direction. As a result, the first connection electrode CE1 may not contact all regions of the second connection electrode CE2 and, thus, may be electrically insulated from the second connection electrode CE2. In addition, the first connection electrode CE1 may not contact the second sensor electrodes SE2 and, thus, may be electrically insulated from the second sensor electrodes SE2.

However, the present invention is not limited thereto. The first connection electrode CE1 may also be electrically connected to the first sensor electrodes SE1 through contact holes CNT provided in the insulating pattern 231 (see, e.g., FIG. 8).

The second conductive layer 240 may include an opaque conductive material, unlike the first conductive layer 220. For example, the second conductive layer 240 may include molybdenum, silver, titanium, copper, aluminum, and/or an alloy of these materials. However, the second conductive layer 240 may also be made of a transparent conductive material, like the first conductive layer 220.

An antireflection layer 260 may be disposed on the second conductive layer 240. The antireflection layer 260 may cover the second conductive layer 240, the insulating layer 230, and the first conductive layer 220. The antireflection layer 260 may reduce the reflectance of external light incident from above the window member 300. The antireflection layer 260 may include, for example, a polarizer and/or a retarder. Although the antireflection layer 260 is disposed directly on the second conductive layer 240 in the drawing, it may also be bonded to a structure disposed under the antireflection layer 260 by an adhesive layer.

The window member 300 is disposed on the touch member 200. The window member 300 may be attached onto the antireflection layer 260 of the touch member 200 by a second adhesive member 172. For example, the second adhesive member 172 may be an OCA or an OCR.

The window member 300 may be made of, for example, glass, sapphire, or plastic. The window member 300 may be rigid, but may also be flexible.

The arrangement of the diffraction patterns 232 and the sensor electrodes of the touch member 200 will now be described in detail.

Figure 3:
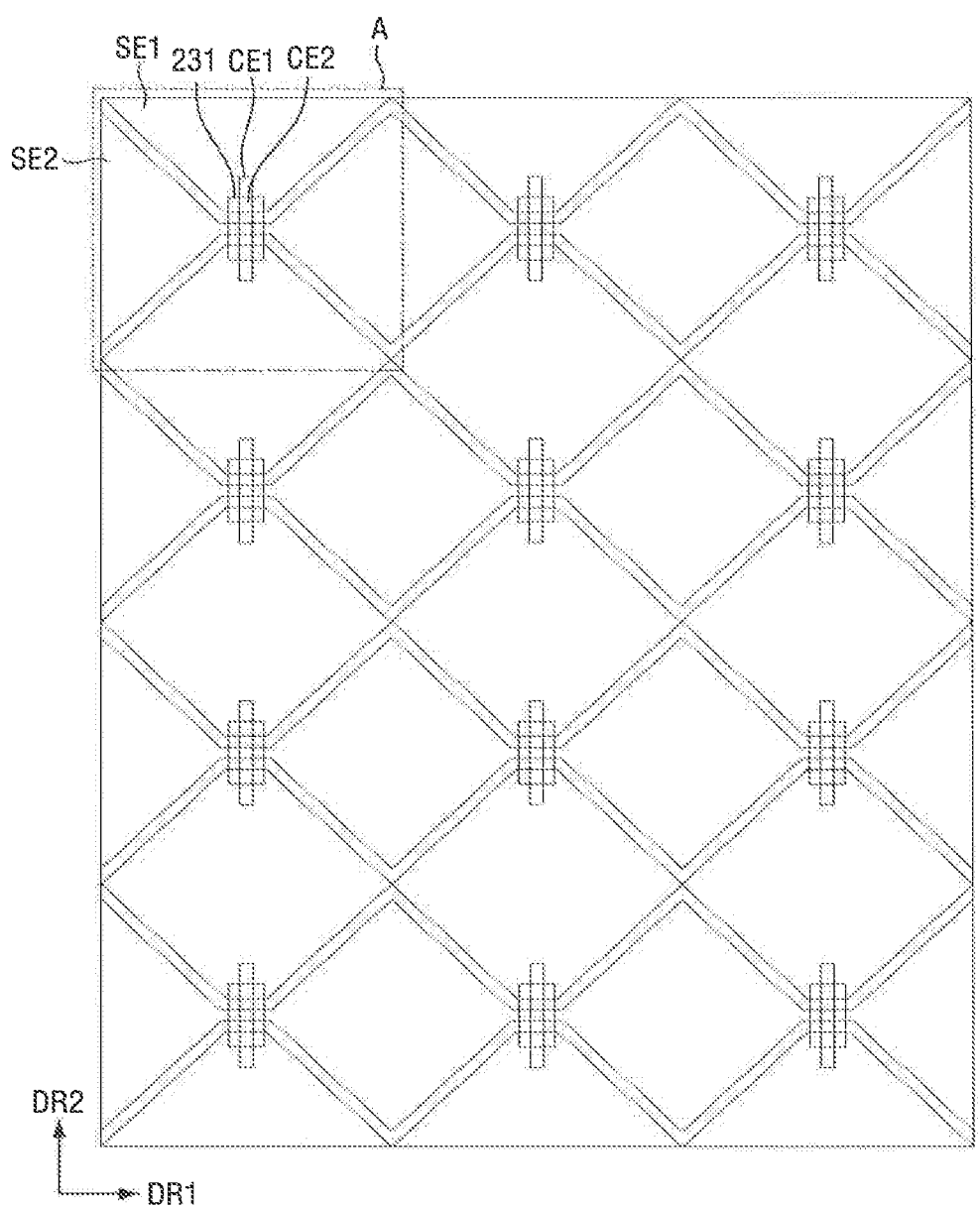
FIG. 3 is a layout view of a touch member according to an exemplary embodiment of the present invention.

FIG. 3 is a layout view of a touch member 200 according to an exemplary embodiment of the present invention. FIG. 4 is an enlarged layout view of a region A of the touch member 200 illustrated in FIG. 3 according to an exemplary embodiment of the present invention.

Referring to FIGS. 3 and 4, a plurality of first sensor electrodes SE1 and a plurality of second sensor electrodes SE2 are arranged in a matrix. The first sensor electrodes SE1 and the second sensor electrodes SE2 may each have a rhombic shape. However, the first sensor electrodes SE1 and the second sensor electrodes SE2 are not limited to the rhombic shape and may also have another polygonal shape.

Each first sensor electrode SE1 is surrounded by at least one second sensor electrode SE2, and each second sensor electrode SE2 is surrounded by at least one first sensor electrode SE1. Each of the first sensor electrodes SE1 is physically separated from adjacent second sensor electrodes SE2. In addition, each of the second sensor electrodes SE2 is physically separated from adjacent first sensor electrodes SE1.

A plurality of first sensor electrodes SE1 may be electrically connected to each other, and a plurality of second sensor electrodes SE2 may be electrically connected to each other. For example, a plurality of first sensor electrodes SE1 belonging to the same column may be electrically connected to each other, and a plurality of second sensor electrodes SE2 belonging to the same row may be electrically connected to each other. For example, the first sensor electrodes SE1 belonging to the same column and adjacent to each other in a second direction DR2 are electrically connected by a first connection electrode CE1. As an additional example, the second sensor electrodes SE2 belonging to the same row and adjacent to each other in a first direction DR1 are electrically connected by a second connection electrode CE2. As described above, the first connection electrode CE1 may be formed of a conductive layer different from that of the first sensor electrodes SE1, and the second connection electrode CE2 may be formed of the same conductive layer as that of the second sensor electrodes SE2 in a manner continuous to the second sensor electrodes SE2. The first connection electrode CE1 and the second connection electrode CE2 intersect each other in plan view. As described above with reference to FIG. 2, an insulating pattern 231 may be interposed between the first connection electrode CE1 and the second connection electrode CE2 to keep the first connection electrode CE1 and the second connection electrode CE2 insulated from each other.

Of the first sensor electrodes SE1, two first sensor electrodes SE1 disposed at opposite ends of each column of the first sensor electrodes SE1 may have a smaller size than the remaining first sensor electrodes SE1. For example, the first sensor electrodes SE1 disposed at the opposite ends of each column of the first sensor electrodes SE1 may be about half the size of first sensor electrodes SE1 disposed on a central portion of the second substrate 210. Further, the first sensor electrodes SE1 disposed at the opposite ends of each column of the first sensor electrodes SE1 may be about half the size of the first sensor electrodes SE1 located between the first sensor electrodes SE1 disposed at the opposite ends of each column of the first sensor electrodes SE1. Of the second sensor electrodes SE2, two second sensor electrodes SE2 disposed at opposite ends of each row of the second sensor electrodes SE2 may have a smaller size than the remaining second sensor electrodes SE2 in the row. For example, the second sensor electrodes SE2 disposed at opposite ends of each row of the second sensor electrodes SE2 may be about half the size of second sensor electrodes SE2 disposed on the central portion of the second substrate 210. Further, the second sensor electrodes SE2 disposed at opposite ends of each row of the second sensor electrodes SE2 may be about half the size of the second sensor electrodes SE2 located between the second sensor electrodes SE2 disposed at the opposite ends of each row of the second sensor electrodes SE2.

Either the first sensor electrodes SE1 or the second sensor electrodes SE2 may be driving electrodes, and the other of the first sensor electrodes SE1 and the second sensor electrodes SE2 may be sensing electrodes.

Referring to FIG. 4 the diffraction patterns 232 of the insulating layer 230 may be disposed in the entire region of, for example, the first and second sensor electrodes SE1 and SE2, except a portion where the insulating pattern 231 is disposed. For example, the diffraction patterns 232 may be disposed not only on the first sensor electrodes SE1 and the second sensor electrodes SE2, but also in the spaces between the first and second sensor electrodes SE1 and SE2. The diffraction patterns 232 may have a width and interval that enable them to diffract emitted light from the display panel DP. The diffraction patterns 232 may be of substantially the same size and may be arranged at substantially constant intervals as illustrated in FIG. 4, but the present invention is not limited thereto. Various other modifications may be applied as long as the diffraction patterns 232 have a size and interval that enable them to diffract emitted light.

The diffraction patterns 232 may have a cylindrical shape in an exemplary embodiment of the present invention. In other words, upper and lower surfaces of the diffraction patterns 232 may have a circular shape. For example, the circular shape may include an ellipse or a polygon that is substantially close to a circle.

The diffraction patterns 232 may diffract light L1 emitted from the organic light emitting layers 140 to generate first through third diffracted light beams L2a, L2b and L2c. As a result, an effective emission area can be increased.

Figure 5:
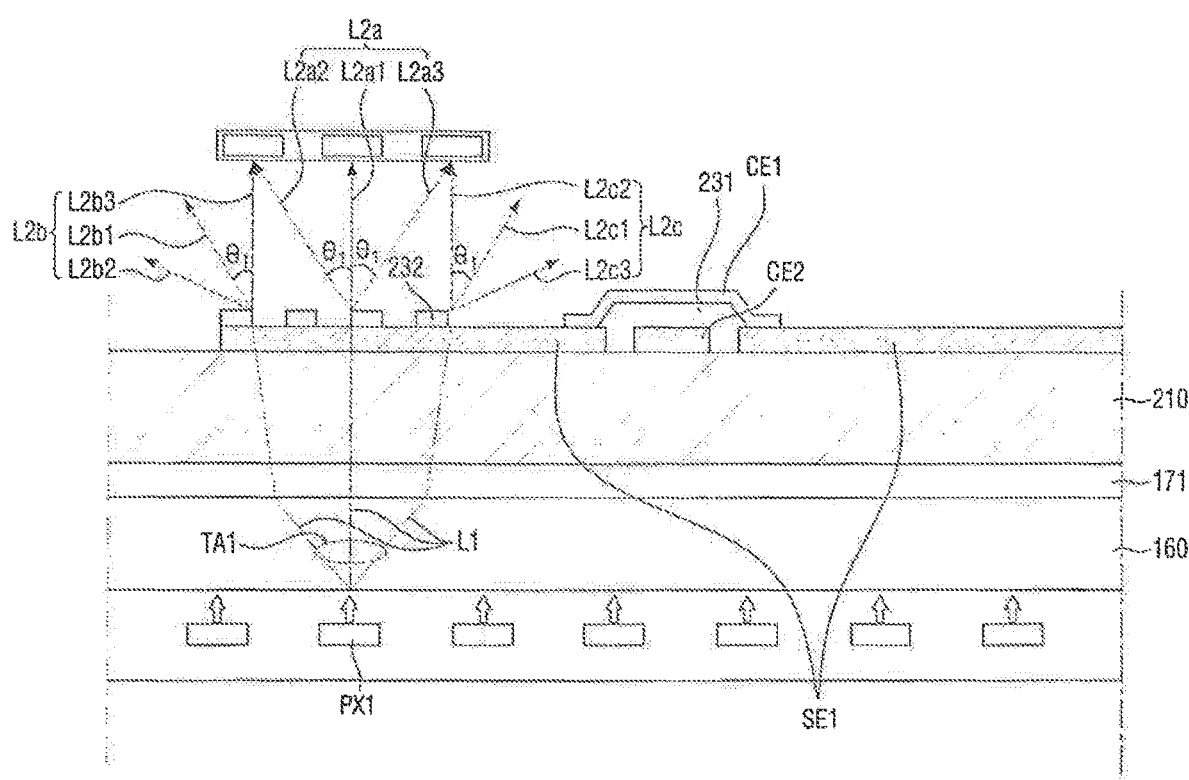
Figure 6A:
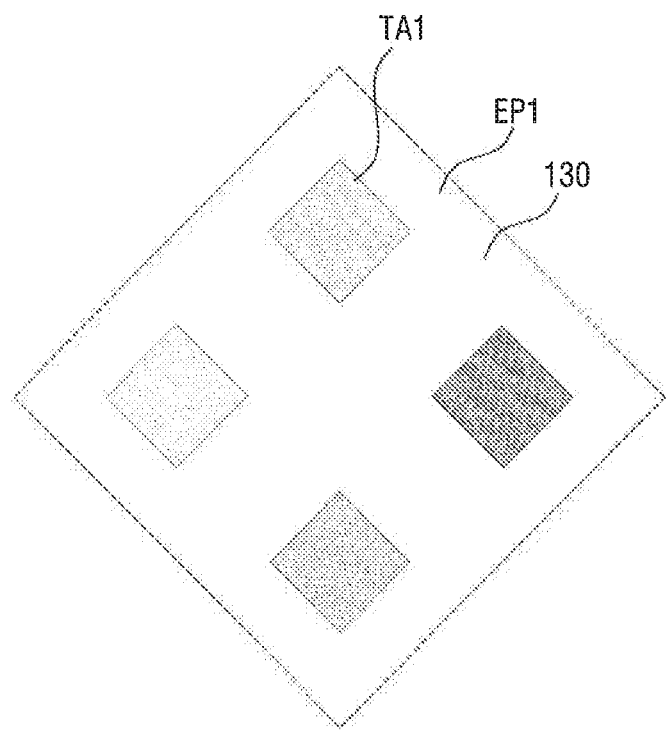
FIG. 6A illustrates a region in which an emission pattern before light passes through diffraction patterns is disposed according to an exemplary embodiment of the present invention.

FIG. 5 is a schematic view illustrating an optical path of the display device to which FIG. 4 is applied according to an exemplary embodiment of the present invention. In FIG. 5, the structure of the display panel DP may be simplified for ease of description. FIG. 6A illustrates a region in which an emission pattern before light passes through the diffraction patterns 232 is disposed, according to an exemplary embodiment of the present invention, and FIG. 6B illustrates a region in which an emission pattern after light passes through the diffraction patterns 232 is disposed, according to an exemplary embodiment of the present invention.

Figure 6B:
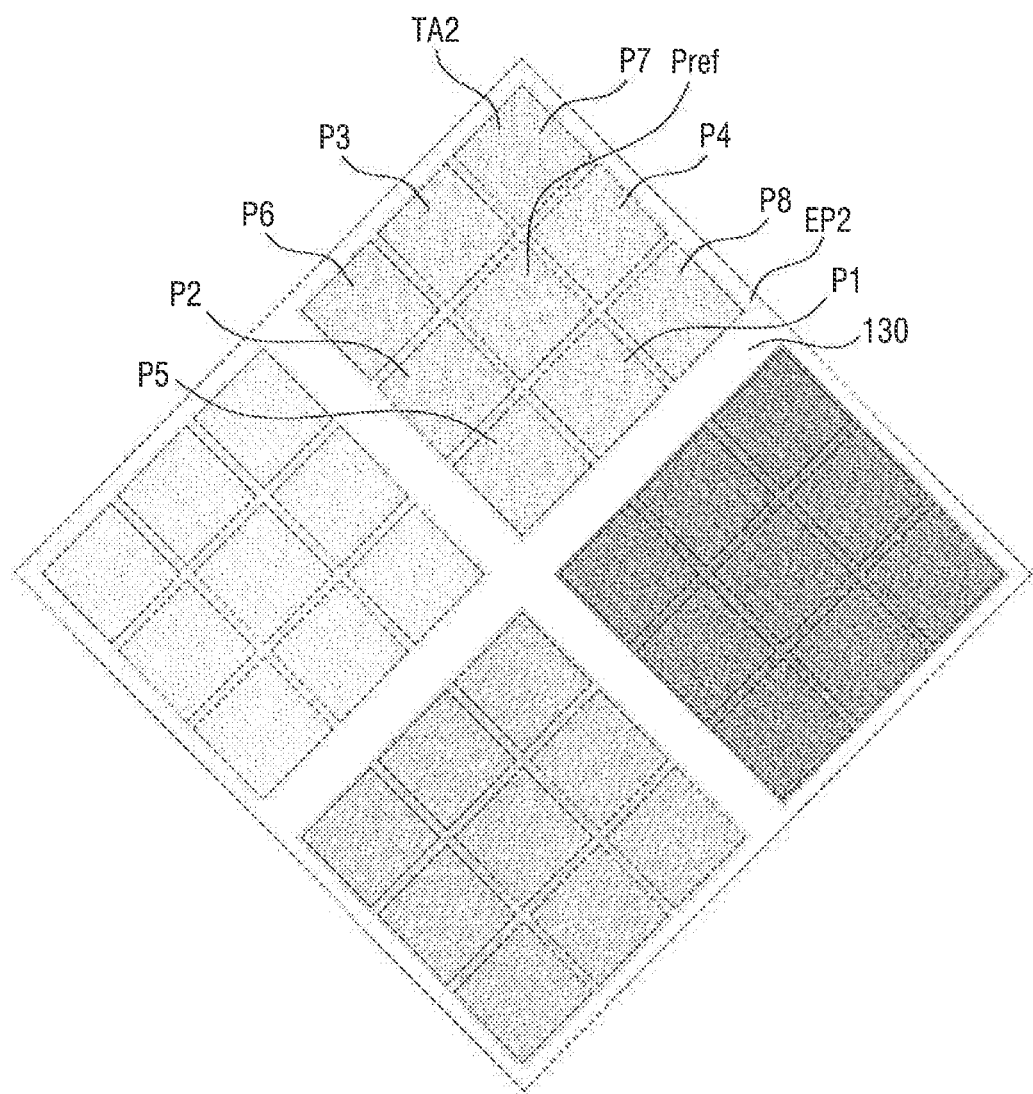
FIG. 6B illustrates a region in which an emission pattern after light passes through the diffraction patterns is disposed according to an exemplary embodiment of the present invention.

Referring to FIGS. 5, 6A and 6B, a case where an emission area is increased by the diffraction of light L1 emitted from an organic light emitting layer 140 will now be described based on a first pixel PX1.

An emission pattern generated in a first region TA1 by the light L1 emitted from the organic light emitting layer 140 is a first emission pattern EP1. In addition, an emission pattern generated in a second region TA2 by light beams L2a, L2b and L2c that have passed through the diffraction patterns 232 is a second emission pattern EP2. Here, the light beams L2a, L2b and L2c that have passed through the diffraction patterns 232 will be referred to as diffracted light beams.

The light L1 emitted from the organic light emitting layer 140 may be provided to the diffraction patterns 232 via the thin-film encapsulation layer 160, the first adhesive member 171, and the touch member 200. The path of the light L1 emitted from the organic light emitting layer 140 may be changed at a predetermined angle by refractive indices of the thin-film encapsulation layer 160 and the touch member 200. For ease of description, changes in the path of the light L1 due to different refractive indices of layers or members disposed on the path of the light L1 may not be illustrated.

The diffraction patterns 232 may diffract the light L1 emitted from the organic light emitting layer 140 to generate the first through third diffracted light beams L2a, L2b and L2c. Each of the first through third diffracted light beams L2a, L2b and L2c may include a zeroth-order diffracted light beam and a first-order diffracted light beam. Here, the zeroth-order diffracted light beam denotes a light beam having the same optical path before and after being diffracted by the diffraction patterns 232. In addition, the first-order diffracted light beam denotes a light beam whose path is changed by the diffraction patterns 232 and which has a first diffraction angle θ1 with respect to the zeroth-order diffracted light beam.

Referring to FIG. 5, for example, reference numerals L2b1, L2a1, and L2c1 indicate zeroth-order diffracted light beams. In addition, reference numerals L2b2, L2b3, L2a2, L2a3, L2c2 and L2c3 indicate first-order diffracted light beams. In an exemplary embodiment of the present invention, each of the first through third diffracted light beams L2a, L2b and L2c may further include a second or higher-order diffracted light beam. In the present specification, a case where each of the first through third diffracted light beams L2a, L2b and L2c includes the zeroth-order diffracted light beam and the first-order diffracted light beam will be described as an example.

The first through third diffracted light beams L2a, L2b and L2c may respectively include first through third effective light beams L2a1, L2b3 and L2c2 having optical paths perpendicular to the first substrate 110, respectively. Here, the perpendicular direction may include a direction substantially perpendicular to the first substrate 110 as well as a direction perfectly perpendicular to the first substrate 110. An effective light beam can include a diffracted light beam of any order as along as it has an optical path perpendicular to the first substrate 110. In other words, the effective light beam can include both the zeroth-order diffracted light beam and the first-order diffracted light beam as long as it has an optical path perpendicular to the first substrate 110.

The diffraction patterns 232 may generate the first through third effective light beams L2a1, L2b3 and L2c2 by diffracting the light L1 emitted from the organic light emitting layer 140. Accordingly, the second emission pattern EP2 may include a reference emission pattern Pref and a plurality of duplicate emission patterns P1 through P8 duplicated from the reference emission pattern Pref. However, the luminance of the reference emission pattern Pref and the luminance of the first duplicate emission pattern P1 may be different from each other. The duplicate emission patterns P1 through P8 will be described below based on the first duplicate emission pattern P1.

The first region TA1 and the second region TA2 may have the same area. In addition, the number of emission patterns included in the second region TA2 is larger than the number of emission patterns included in the first region TA1. This indicates that the area of an emission region in the second region TA2 is larger than the area of the first region TA1. In other words, it may be expressed that the area of a non-light emitting region (i.e., a non-emission region) is smaller in the second region TA2 than in the first region TA1.

When the area of the emission region is large, it may be expressed that an emission area ratio is large. The emission area ratio is a ratio of the area of an emission pattern existing in a region to the area of the region. Here, the emission pattern used to calculate the emission area ratio may include both a reference emission pattern and duplicate emission patterns. For example, while the second region TA2 has nine emission patterns including the reference emission pattern Pref and the duplicate emission patterns P1 through P8, the first region TA1 has one emission pattern. Accordingly, the effective emission area ratio of the second region TA2 is larger than that of the first region TA1. Therefore, the display device according to the current embodiment can reduce the area of the non-emission region visible to a user and increase the emission efficiency of light L1 emitted from a plurality of organic light emitting layers 140.

Hereinafter, exemplary embodiments of the present invention will be described. In the following exemplary embodiments of the present invention, the same elements as those describe above may be indicated by the same reference numerals, and a redundant description of the elements may be omitted or given briefly.

Figure 7:
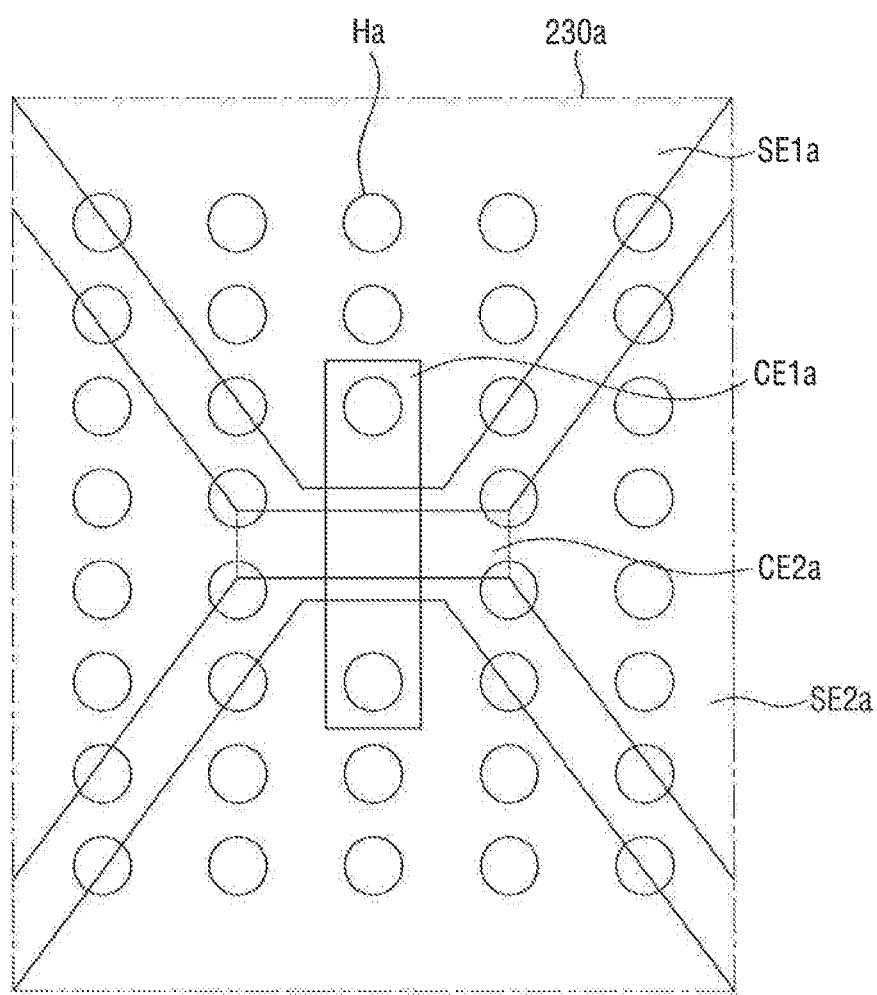
FIG. 7 is a layout view of a touch member according to an exemplary embodiment of the present invention.
Figure 8:
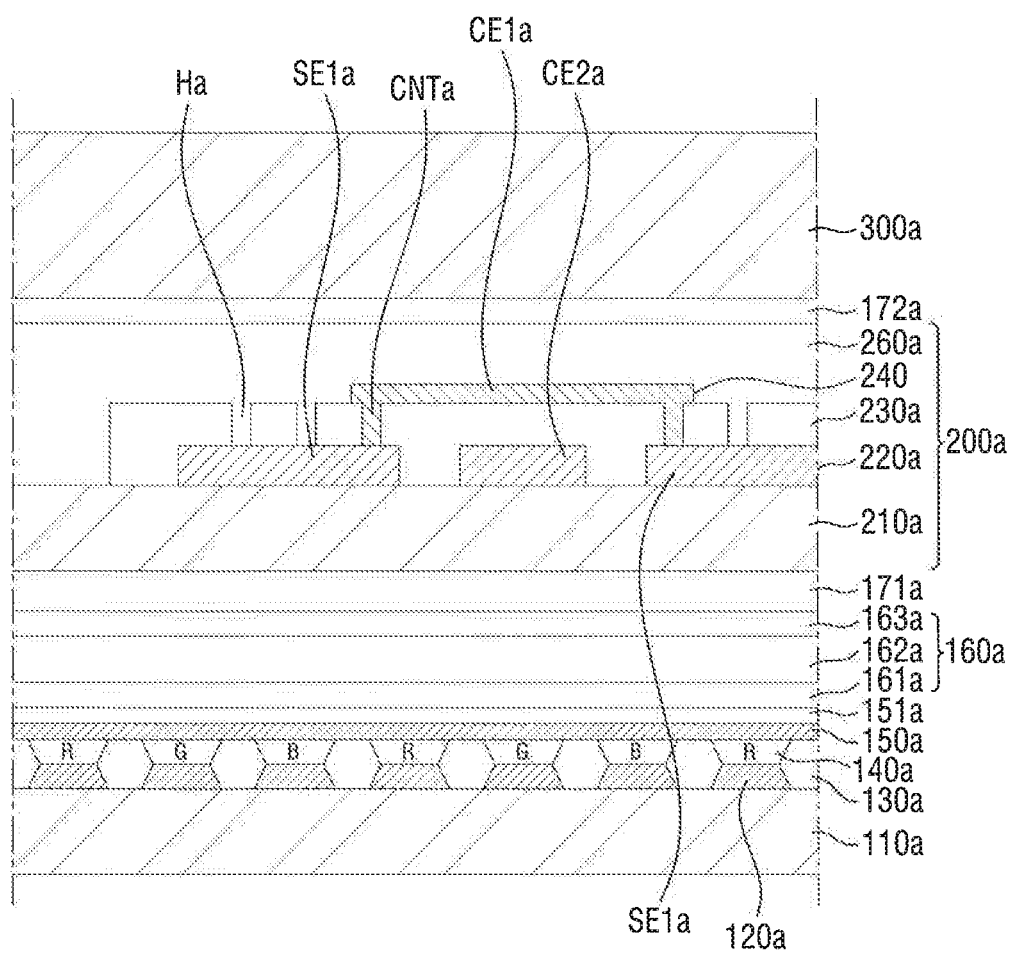

FIG. 7 is a layout view of a touch member 200a according to an exemplary embodiment of the present invention, and FIG. 8 is a cross-sectional view of a display device to which FIG. 7 is applied according to an exemplary embodiment of the present invention.

Referring to FIGS. 7 through 8, the display device according to the current embodiment is different from the display device illustrated in FIGS. 2 through 4 in that a first connection electrode CE1a is connected to first sensor electrodes SE1a through contact holes CNTa formed in an insulating layer 230a, and that the insulating layer 230a includes a plurality of holes Ha.

For example, in the current embodiment, the insulating layer 230a may be disposed on a first conductive layer 220a, and the first conductive layer 220a may include the first sensor electrodes SE1 and second sensor electrodes SE2. The insulating layer 230a may extend to outside the first conductive layer 220a. For example, the insulating layer 230a may extend beyond the first conductive layer 220a such that the insulating layer 230a may overlap side surfaces of the first conductive layer 220a. In addition, the insulating layer 230a may have the contact holes CNTa and the holes Ha penetrating the insulating layer 230a in the thickness direction. The first connection electrode CE1a may be electrically connected to the first sensor electrodes SE1a through the contact holes CNTa. In addition, a second connection electrode CE2a may connect adjacent second sensor electrodes SE2a. In the current embodiment, the insulating layer 230a including the holes Ha that partially expose the first conductive layer 220a and penetrate the insulating layer 230a in the thickness direction may be diffraction patterns. For example, the holes Ha may form the diffraction patterns. As an additional example, the holes Ha may be a plurality of insulating diffraction holes. As another example, the holes Ha may have a cylindrical shape. In other words, upper and lower surfaces of the holes Ha may have a circular shape. For example, the circular shape may include an ellipse or a polygon that is substantially close to a circle.

In the current embodiment, if diffraction patterns are provided on an optical path, for example, on the touch member 200a, the proportion of the area of an emission pattern existing in a region to the area of the region may also be increased by the diffraction and interference of light by the diffraction patterns. Therefore, the area of a non-emission region visible to a user can be reduced.

Figure 9:
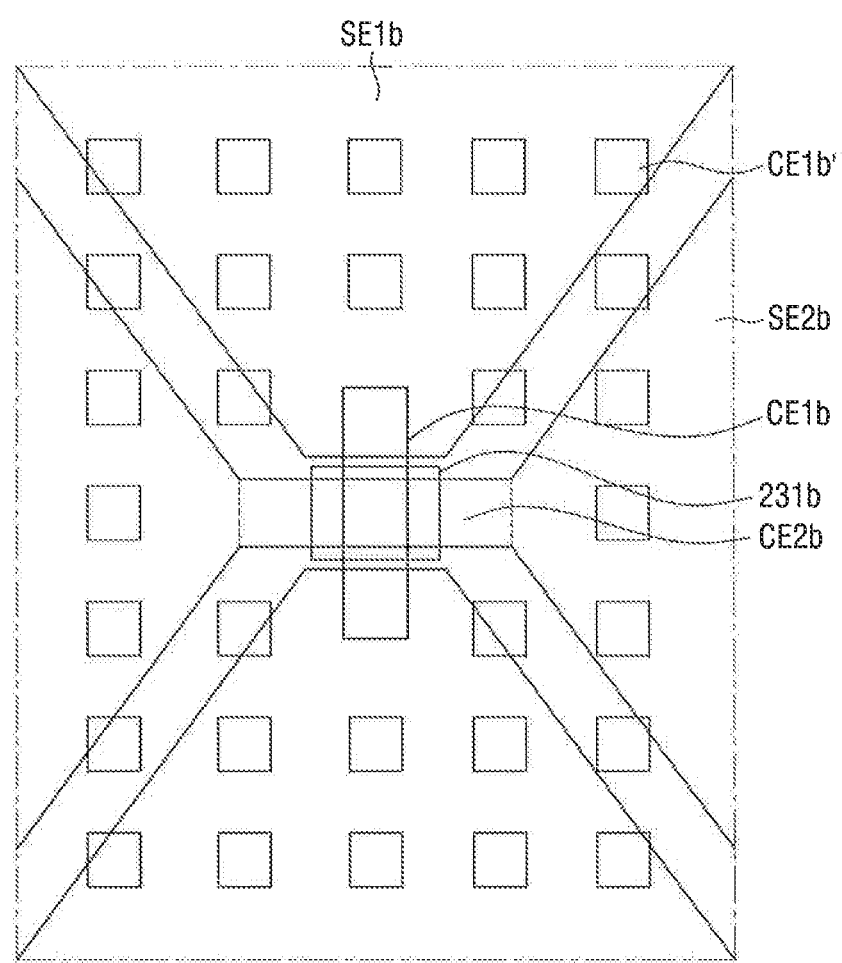
FIG. 9 is a layout view of a touch member according to an exemplary embodiment of the present invention.
Figure 10:
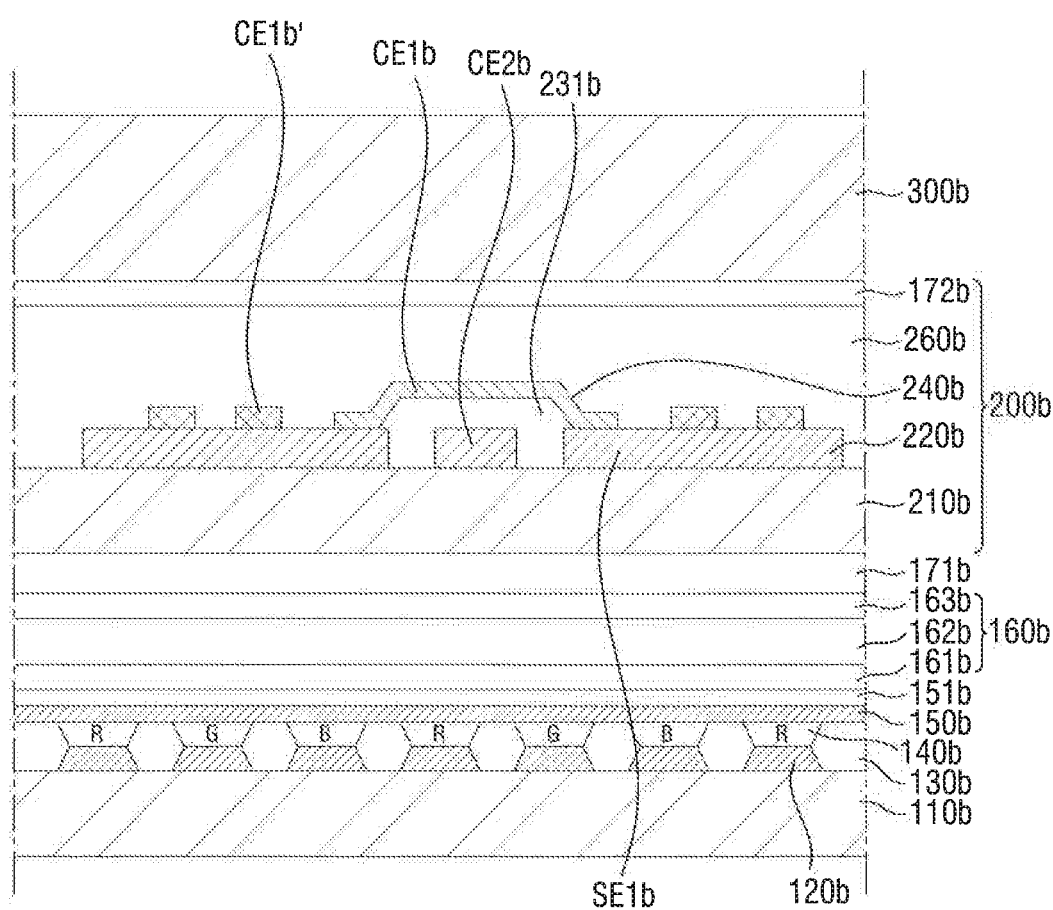

FIG. 9 is a layout view of a touch member 200b according to an exemplary embodiment of the present invention, and FIG. 10 is a cross-sectional view of a display device to which FIG. 9 is applied according to an exemplary embodiment of the present invention.

Referring to FIGS. 9 through 10, the display device according to the current embodiment is different from the display device illustrated in FIGS. 2 through 4 in that a second conductive layer 240b further includes a plurality of dummy electrodes CE1b' disposed on a first conductive layer 220b.

For example, the second conductive layer 240b may be disposed on the first conductive layer 220b including a plurality of first sensor electrodes SE1b and a plurality of second sensor electrodes SE2b separated from each of the first sensor electrodes SE1b. The second conductive layer 240b may have the dummy electrodes CE1b' disposed on the first sensor electrodes SE1b and the second sensor electrodes SE2b of the first conductive layer 220b. The second conductive layer 240b may include a first connection electrode CE1b connecting adjacent first sensor electrodes SE1b, and the first conductive layer 220b may include a second connection electrode CE2b connecting adjacent second sensor electrodes SE2b. An insulating layer (e.g., an insulating pattern 231b) may be disposed between the first connection electrode CE1b and the second connection electrode CE2b to insulate the first connection electrode CE1b and the second connection electrode CE2b from each other. The dummy electrodes CE1b' may have, for example, a cylindrical shape. In other words, upper and lower surfaces of the dummy electrodes CE1b' may have a circular shape. For example, the circular shape may include an ellipse or a polygon that is substantially close to a circle. In the current embodiment, the dummy electrodes CE1b' may function as diffraction patterns that diffract light emitted from organic light emitting layers 140b. For example, the dummy electrodes CE1b' may be diffraction patterns. In other words, the dummy electrodes CE1b' may be a plurality of conductive diffraction patterns. In the current embodiment, the dummy electrodes CE1b' may be made of the same material as that of the second conductive layer 240b described above.

In the current embodiment, if the diffraction patterns are provided on an optical path, for example, on the touch member 200b, the proportion of the area of an emission pattern existing in a region to the area of the region may also be increased by the diffraction and interference of light by the diffraction patterns. Therefore, the area of a non-emission region visible to a user can be reduced.

Figure 11:
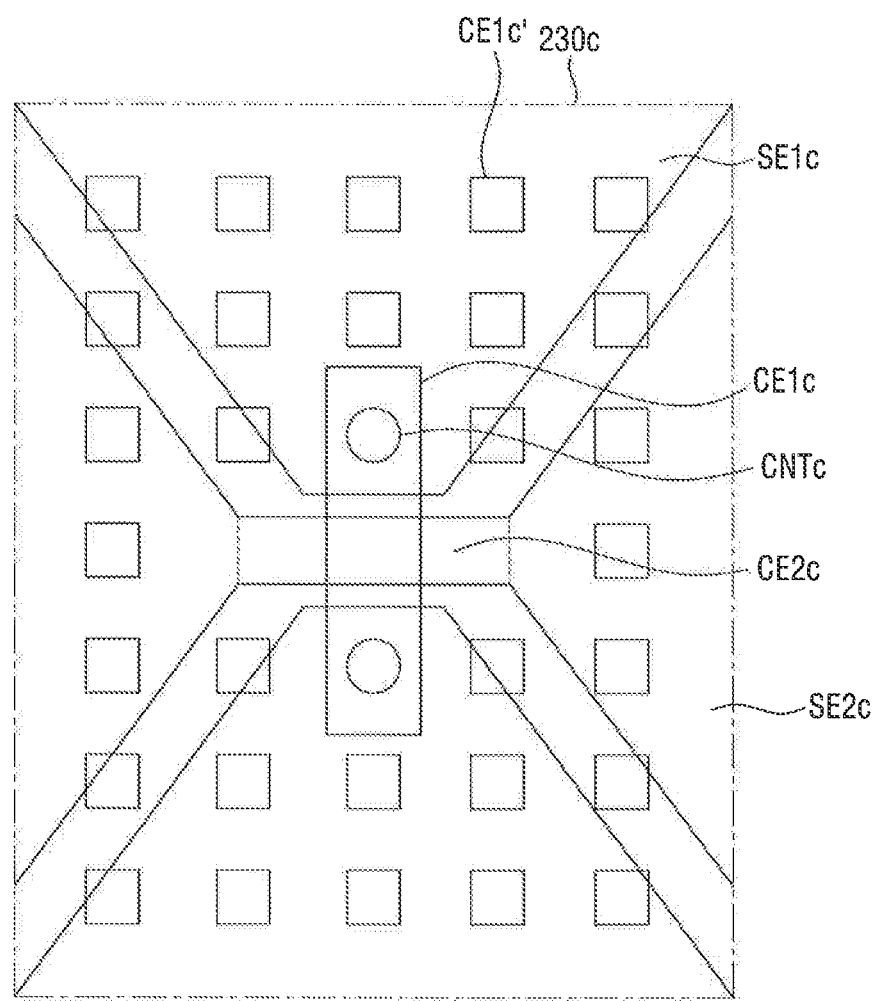
FIG. 11 is a layout view of a touch member according to an exemplary embodiment of the present invention.
Figure 12:
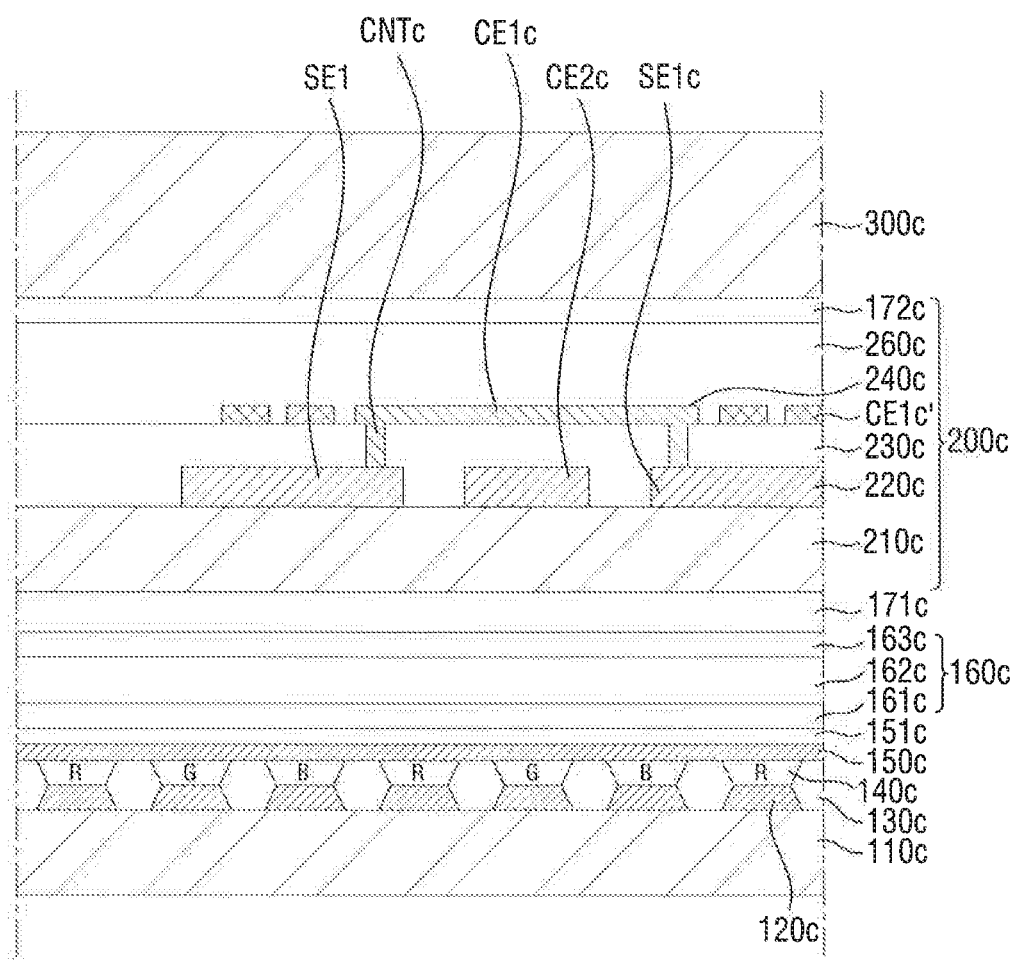

FIG. 11 is a layout view of a touch member 200c according to an exemplary embodiment of the present invention, and FIG. 12 is a cross-sectional view of a display device to which FIG. 11 is applied according to an exemplary embodiment of the present invention.

Referring to FIGS. 11 and 12, the display device according to the current embodiment is different from the display device illustrated in FIGS. 2 through 4 in that a first connection electrode CE1c is connected to first sensor electrodes SE1c through contact holes CNTc formed in an insulating layer 230c, and that a second conductive layer 240c disposed on the insulating layer 230c further includes a plurality of dummy electrodes CE1c'.

For example, in the current embodiment, the insulating layer 230c may be disposed on a first conductive layer 220c and extend to outside the first conductive layer 220c. In addition, the insulating layer 230c may have the contact holes CNTc. The first connection electrode CE1c may be electrically connected to the first sensor electrodes SE1c through the contact holes CNTc. The dummy electrodes CE1c' may be disposed on the insulating layer 230c. In the current embodiment, the dummy electrodes CE1c' may be diffraction patterns that diffract light emitted from organic light emitting layers 140c. In the current embodiment, the dummy electrodes CE1c' may be made of the same material as that of the second conductive layer 240c described above.

In the current embodiment, if diffraction patterns are provided on an optical path, for example, on the touch member 200c, the proportion of the area of an emission pattern existing in a region to the area of the region may also be increased by the diffraction and interference of light by the diffraction patterns. Therefore, the area of a non-emission region visible to a user can be reduced.

Figure 13:
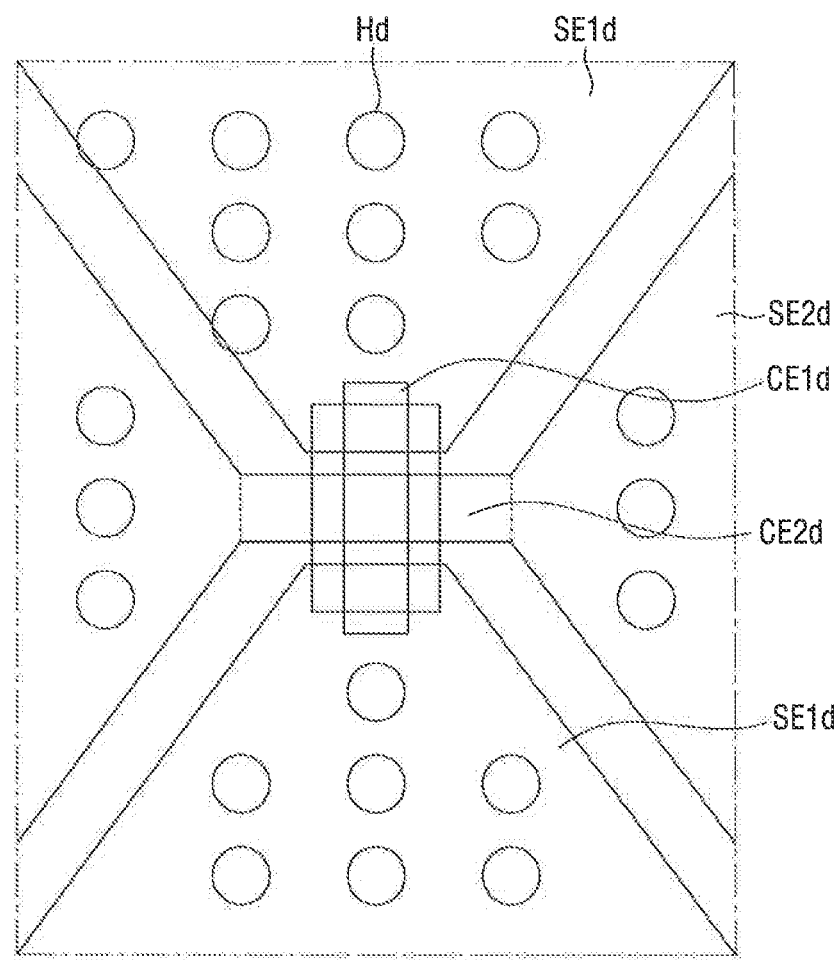
FIG. 13 is a layout view of a touch member according to an exemplary embodiment of the present invention.
Figure 14:
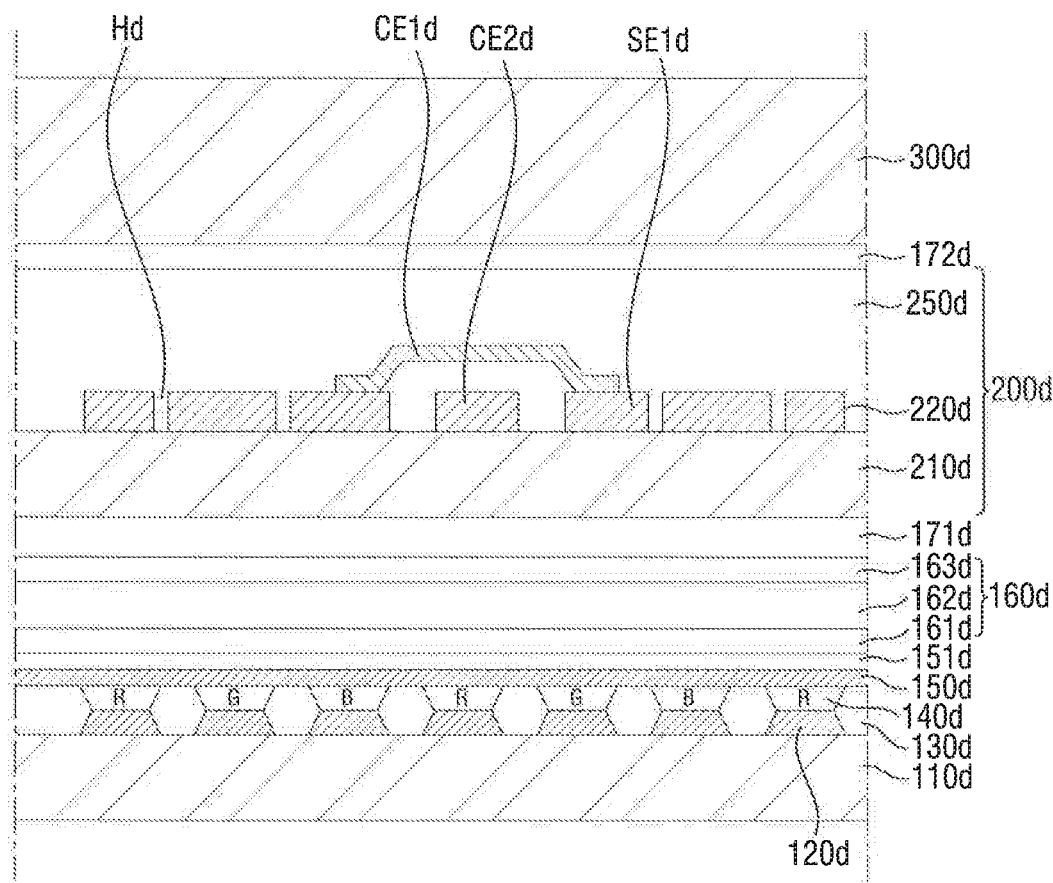

FIG. 13 is a layout view of a touch member 200d according to an exemplary embodiment of the present invention, and FIG. 14 is a cross-sectional view of a display device to which FIG. 13 is applied according to an exemplary embodiment of the present invention.

Referring to FIGS. 13 and 14, the display device according to the current embodiment is different from the display device illustrated in FIGS. 2 through 4 in that a first conductive layer 220d includes a plurality of holes Hd partially exposing a second substrate 210d.

For example, in the current embodiment, the first conductive layer 220d, including a plurality of first sensor electrodes SE1d and a plurality of second sensor electrodes SE2d separated from each of the first sensor electrodes SE1d, may have the holes Hd penetrating the first conductive layer 220d in the thickness direction. In the current embodiment, the holes Hd may be diffraction patterns that diffract light emitted from organic light emitting layers 140d. For example, the holes Hd may form the diffraction patterns. As an additional example, the holes Hd in the first conductive layer 220d may be conductive diffraction holes. As another example, the holes Hd may have a cylindrical shape. In other words, upper and lower surfaces of the holes Hd may have a circular shape. For example, the circular shape may include an ellipse or a polygon that is substantially close to a circle.

In the current embodiment, if diffraction patterns are provided on an optical path, for example, on the touch member 200d, the proportion of the area of an emission pattern existing in a region to the area of the region may also be increased by the diffraction and interference of light by the diffraction patterns. Therefore, the area of a non-emission region visible to a user can be reduced.

Figure 15:
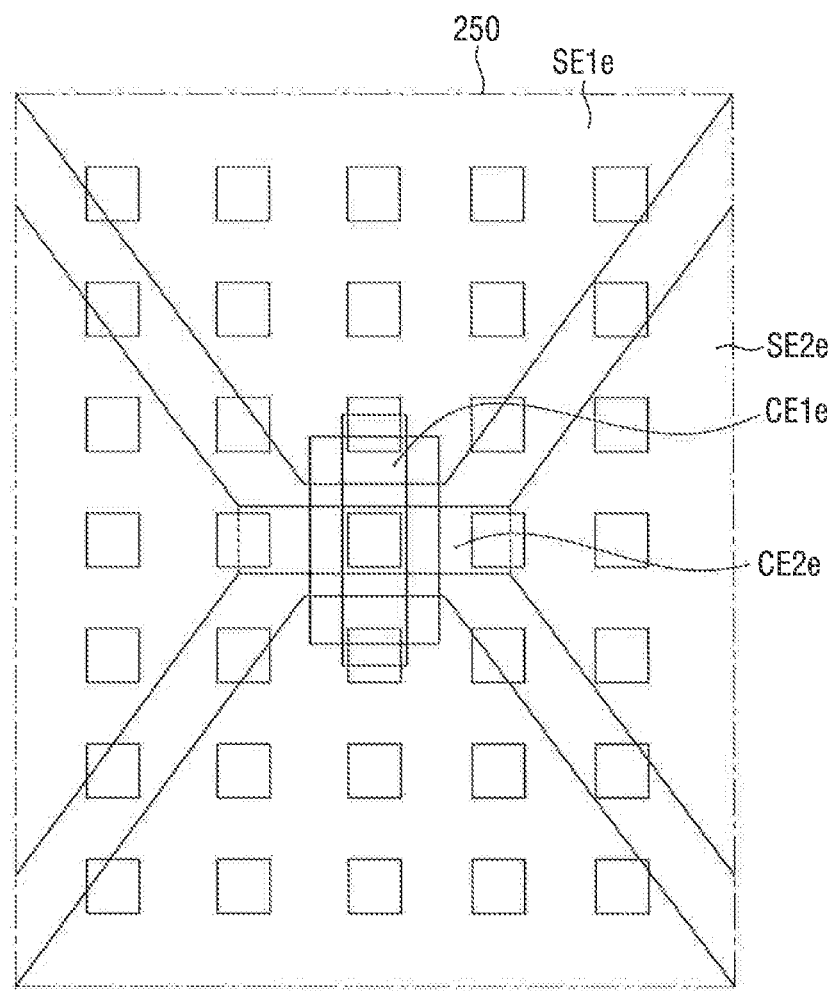
FIG. 15 is a layout view of a touch member according to an exemplary embodiment of the present invention.
Figure 16:
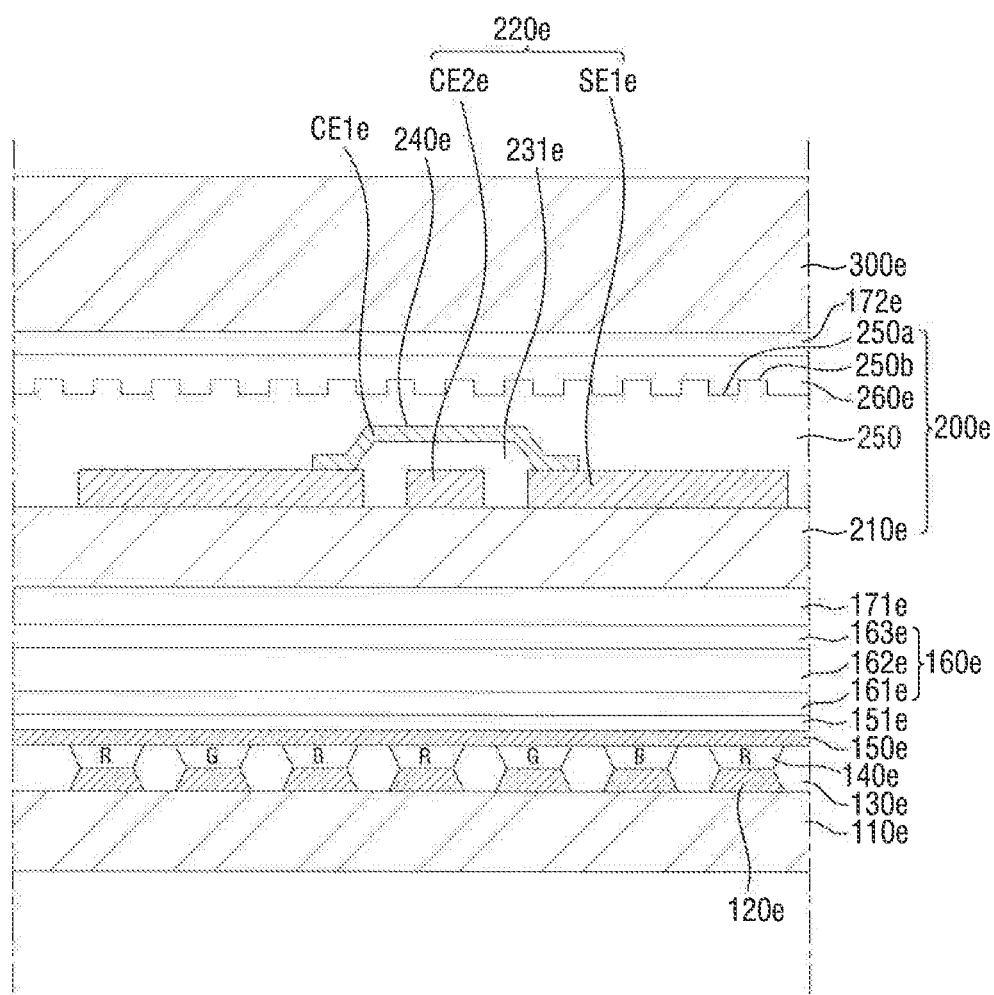

FIG. 15 is a layout view of a touch member 200c according to an exemplary embodiment of the present invention, and FIG. 16 is a cross-sectional view of a display device to which FIG. 15 is applied according to an exemplary embodiment of the present invention.

Referring to FIGS. 15 and 16, the display device according to the current embodiment is different from the display device illustrated in FIGS. 2 through 4 in that it includes a second insulating layer 250 disposed on a first conductive layer 220e and a second conductive layer 240e.

For example, the second insulating layer 250 may be disposed on the first conductive layer 220e and the second conductive layer 240e and extend to outside the first conductive layer 220e and the second conductive layer 240e. The second insulating layer 250 may include recesses 250b and protrusions 250a. A first insulating layer may be disposed between the first conductive layer 220e and the second insulating layer 250, and the second conductive layer 240e may be disposed between the second insulating layer 250 and the first insulating layer. The first insulating layer may include an insulating pattern 231e disposed between a first connection electrode CE1e and a second connection electrode CE2e. In the current embodiment, the protrusions 250a protruding upward in the thickness direction of the second insulating layer 250 may be diffraction patterns that diffract light emitted from organic light emitting layers 140e. For example, the protrusions 250a and the recesses 250b in the second insulating layer 250 may form the diffraction patterns.

The second insulating layer 250 may be made of an inorganic insulating material such as silicon oxide, silicon nitride, silicon oxynitride, hafnium oxide, aluminum oxide, titanium oxide, tantalum oxide, zinc oxide, or may include an organic insulating material such as polyacrylates resin, epoxy resin, phenolic resin, polyamides resin, polyimides resin, unsaturated polyesters resin, polyphenylenethers resin, polyphenylenesulfides resin and/or benzocyclobutene (BCB).

In the current embodiment, if diffraction patterns are provided on an optical path, for example, on the touch member 200e, the proportion of the area of an emission pattern existing in a region to the area of the region may also be increased by the diffraction and interference of light by the diffraction patterns. Therefore, the area of a non-emission region visible to a user can be reduced.

Figure 17:
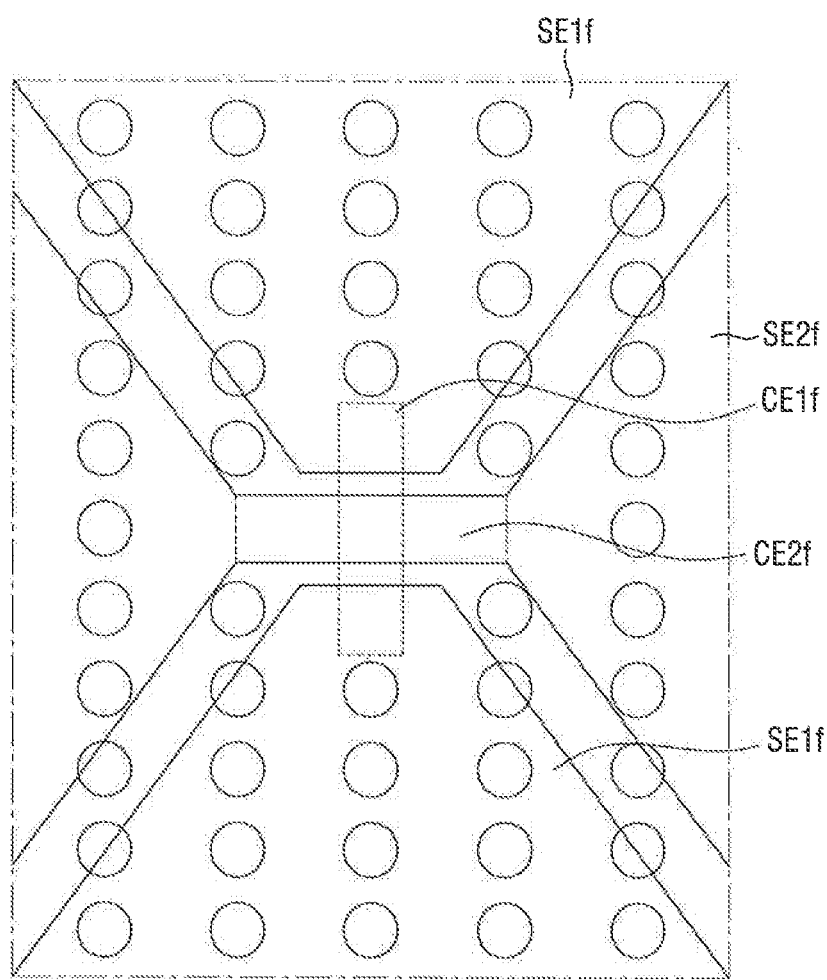
FIG. 17 is a layout view of a touch member according to an exemplary embodiment of the present invention.
Figure 18:
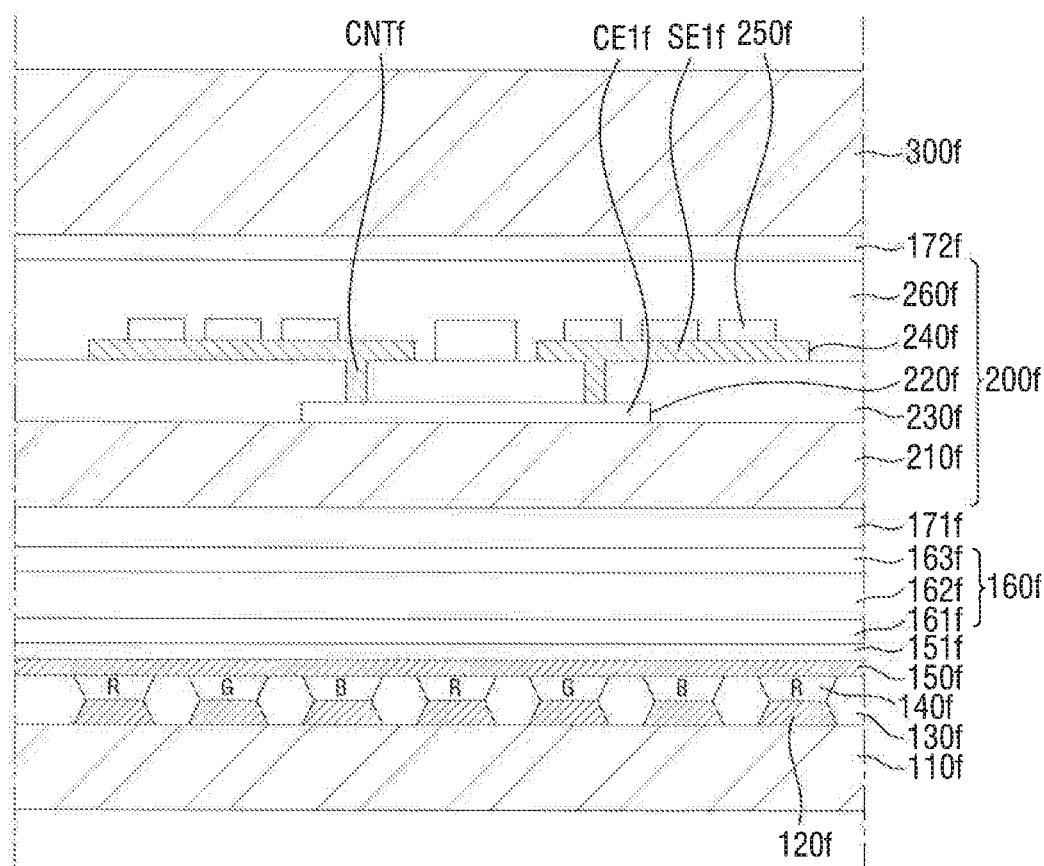

FIG. 17 is a layout view of a touch member 200f according to an exemplary embodiment of the present invention, and FIG. 18 is a cross-sectional view of a display device to which FIG. 17 is applied according to an exemplary embodiment of the present invention.

Referring to FIGS. 17 and 18, the display device according to the current embodiment is different from the display device illustrated in FIGS. 2 through 4 in that a first conductive layer 220f includes a first connection electrode CE1f. In addition, a second conductive layer 240f includes first sensor electrodes SE1f, second sensor electrodes SE2f and a second connection electrode CE2f. Further, the first connection electrode CE1f is connected to the first sensor electrodes SE1f through a plurality of contact holes CNTf formed in an insulating layer 230f, and diffraction patterns 250f are formed on the second conductive layer 240f. For example, the diffractions patterns 250f may be insulating diffraction patterns.

For example, the second conductive layer 240f including the first sensor electrodes SE1f, the second sensor electrodes SE2f and the second connection electrode CE2f may be disposed on the first conductive layer 220f including the first connection electrode CE1f. For example, the insulating layer 230f may be disposed directly on the first conductive layer 220f. The insulating layer 230f may have the contact holes CNTf. The second conductive layer 240f may be disposed on the insulating layer 230f. The first connection electrode CE1f may be connected to the first sensor electrodes SE1f through the contact holes CNTf. In the current embodiment, the diffraction patterns 250f disposed on the second conductive layer 240f may diffract light emitted from organic light omitting layers 140f.

In the current embodiment, if the diffraction patterns 250f are provided on an optical path, for example, on the touch member 200f, the proportion of the area of an emission pattern existing in a region to the area of the region may also be increased by the diffraction and interference of light by the diffraction patterns 250f. Therefore, the area of a non-emission region visible to a user can be reduced.

Figure 19:
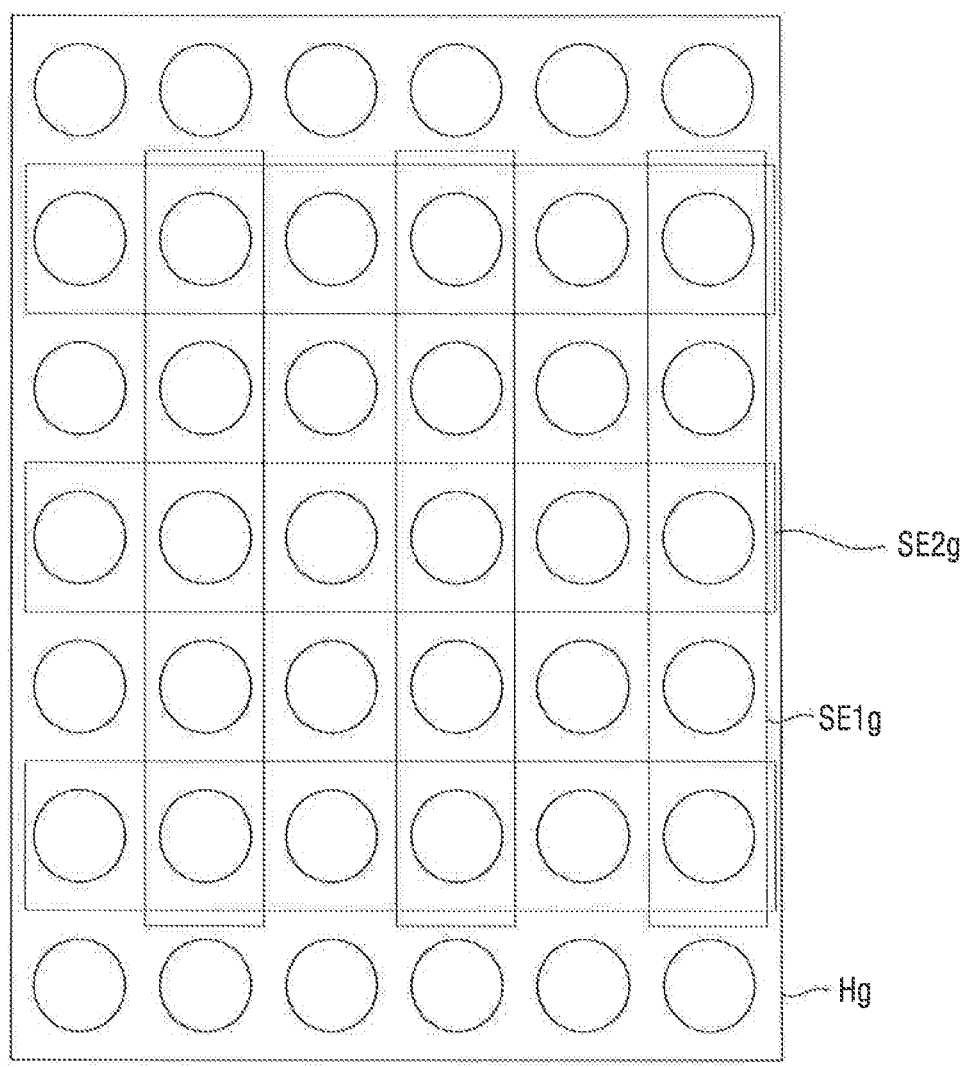
FIG. 19 is a layout view of a touch member according to an exemplary embodiment of the present invention.
Figure 20:
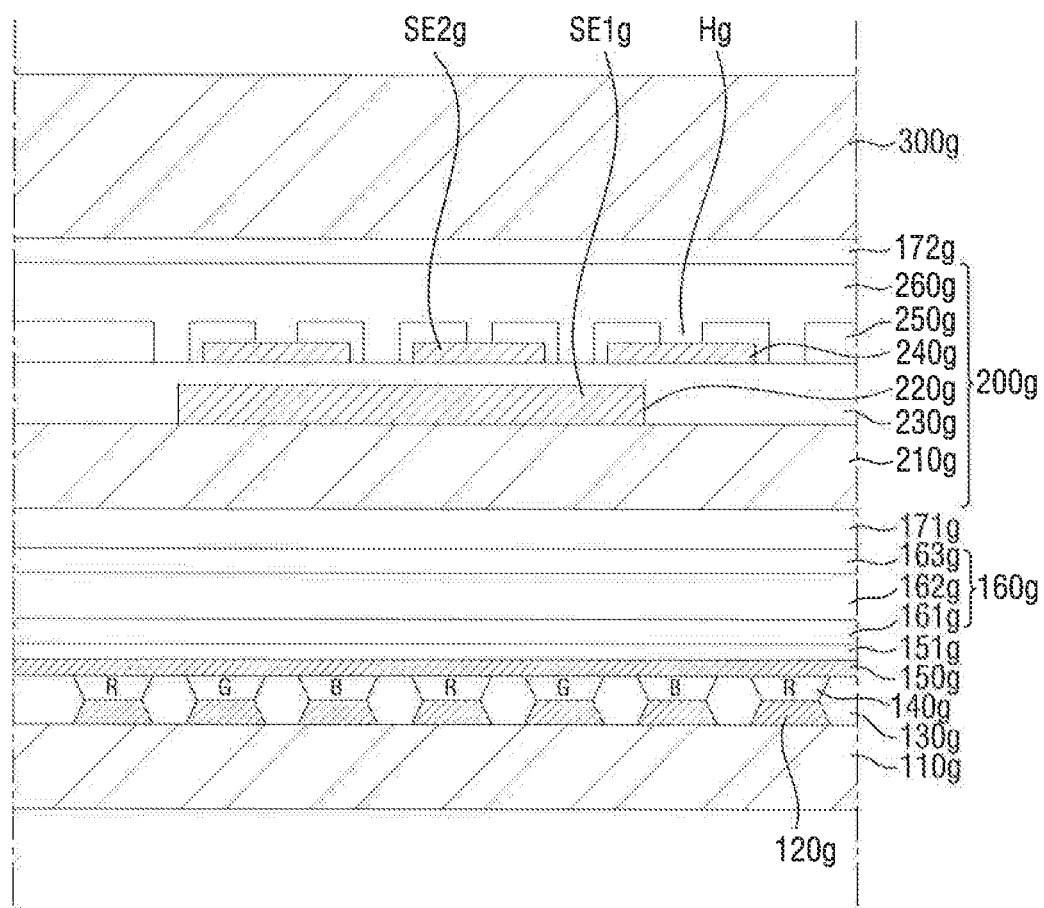

FIG. 19 is a layout view of a touch member 200g according to an exemplary embodiment of the present invention, and FIG. 20 is a cross-sectional view of a display device to which FIG. 19 is applied according to an exemplary embodiment of the present invention.

Referring to FIGS. 19 and 20, the display device according to the current embodiment is different from the display device illustrated in FIGS. 2 through 4 in that the touch member 200g has a multilayer structure in which a first conductive layer 220g, which includes first sensor electrodes SE1g, and a second conductive layer 240g, which includes second sensor electrodes SE2g, are stacked. In addition, the second insulating layer 250g is disposed on the second conductive layer 240g.

For example, columns of the first sensor electrodes SE1g may be arranged in the first direction DR1 and may each extend in the second direction DR2. A first insulating layer 230g may be disposed on the first conductive layer 220g and an exposed portion of the second substrate 210g. In addition, rows of the second sensor electrodes SE2g may be arranged in the second direction DR2 and may each extend in the first direction DR1. A second insulating layer 250g may be disposed on the second conductive layer 240g. The second insulating layer 250g may have a plurality of holes Hg exposing some regions of the second conductive layer 240g and some regions of the first insulating layer 230g. In the current embodiment, the holes Hg may be diffraction patterns that diffract light emitted from organic light emitting layers 140g. For example, the second insulating layer 250g including the holes Hg may provide diffraction patterns.

In the current embodiment, if diffraction patterns are provided on an optical path, for example, on the touch member 200g, the proportion of the area of an emission pattern existing in a region to the area of the region may also be increased by the diffraction and interference of light by the diffraction patterns. Therefore, the area of a non-emission region visible to a user can be reduced.

According to exemplary embodiments of the present invention, an effective emission area ratio can be increased.

In addition, a screen door effect of a display device can be suppressed.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. A display device comprising:
a display panel; and
a touch member disposed on the display panel,
wherein the touch member comprises a first conductive layer and a first insulating layer, wherein the first insulating layer is disposed on the first conductive layer and includes diffraction patterns, wherein the first conductive layer comprises a plurality of first sensor electrodes and a plurality of second sensor electrodes, wherein the diffraction patterns are disposed on upper surfaces of the first sensor electrodes and the second sensor electrodes, wherein the diffraction patterns are disposed above the first sensor electrodes and the second sensor electrodes, and
wherein the first sensor electrodes are different from the second sensor electrodes.

2. The display device of claim 1, wherein the plurality of second sensor electrodes are separated from each of the first sensor electrodes.

3. The display device of claim 2, wherein the diffraction patterns comprise a plurality of insulating diffraction patterns disposed on the first sensor electrodes and the second sensor electrodes.

4. The display device of claim 3, wherein the first conductive layer further comprises a second connection electrode connecting adjacent second sensor electrodes.

5. The display device of claim 4, further comprising a second conductive layer disposed on the first insulating layer and comprising a first connection electrode connecting adjacent first sensor electrodes.

6. The display device of claim 5, wherein the first insulating layer further comprises an insulating pattern disposed between the first connection electrode and the second connection electrode and separated from the insulating diffraction patterns.

7. The display device of claim 6, wherein the insulating diffraction patterns are disposed between the first sensor electrodes and the second electrodes.

8. The display device of claim 7, wherein the insulating diffraction patterns have a substantially constant size and are arranged at substantially constant intervals.

9. The display device of claim 5, wherein the first conductive layer comprises a transparent conductive material, and the second conductive layer comprises an opaque conductive material.

10. The display device of claim 2, wherein the first insulating layer comprises a plurality of insulating diffraction holes exposing the first sensor electrodes and the second sensor electrodes, and penetrating the first insulating layer in a thickness direction, wherein the plurality of insulating diffraction holes form the diffraction patterns.

11. The display device of claim 10, further comprising a second conductive layer which is disposed on the first insulating layer and comprises a first connection electrode connecting adjacent first sensor electrodes, wherein the first conductive layer further comprises a second connection electrode connecting adjacent second sensor electrodes.

12. The display device of claim 2, wherein the first insulating layer comprises recesses and protrusions, wherein the recesses and protrusions are disposed on the first sensor electrodes and the second sensor electrodes, wherein the recesses and protrusions form the diffraction patterns.

13. The display device of claim 1, wherein the diffraction patterns overlap the upper surfaces of the first sensor electrodes and the second sensor electrodes.

14. The display device of claim 1, wherein the diffraction patterns overlap pixels of the display panel.

15. A display device comprising:
a display panel; and
a touch member disposed on the display panel,
wherein the touch member comprises a first conductive layer and a first insulating layer, wherein the first insulating layer is disposed on the first conductive layer and includes diffraction patterns, wherein the first conductive layer comprises a plurality of first sensor electrodes and a plurality of second sensor electrodes separated from each of the first sensor electrodes,
wherein the first insulating layer comprises recesses and protrusions, wherein the recesses and protrusions are disposed on the first sensor electrodes and the second sensor electrodes, wherein the recesses and protrusions form the diffraction patterns, wherein the display device further comprises a second conductive layer and a second insulating layer, wherein the second insulating layer is disposed between the first conductive layer and the first insulating layer,
the second conductive layer is disposed between the second insulating layer and the first insulating layer,
the first conductive layer further comprises a second connection electrode connecting adjacent second sensor electrodes,
the second conductive layer comprises a first connection electrode connecting adjacent first sensor electrodes, and
the second insulating layer comprises an insulating pattern disposed between the first connection electrode and the second connection electrode.

16. A display device comprising:
a display panel; and
a touch member disposed on the display panel,
wherein the touch member comprises a first conductive layer, an insulating layer, and a second conductive layer disposed below the first conductive layer, wherein the first conductive layer includes diffraction patterns, wherein the insulating layer is stacked on the first conductive layer, wherein the second conductive layer includes a plurality of first sensor electrodes and a plurality of second sensor electrodes, and wherein the diffraction patterns are disposed on upper surfaces of the first sensor electrodes and the second sensor electrodes, wherein the diffraction patterns are disposed above the first sensor electrodes and the second sensor electrodes, and wherein the first sensor electrodes are different from the second sensor electrodes.

17. The display device of claim 14, wherein the insulating layer comprises an insulating pattern disposed between a first connection electrode connecting adjacent first sensor electrodes and a second connection electrode connecting adjacent second sensor electrodes.

18. The display device of claim 14, wherein the plurality of second sensor electrodes is separated from each of the first sensor electrodes.

19. The display device of claim 18, wherein the diffraction patterns comprises a plurality of conductive diffraction patterns disposed on the first sensor electrodes and the second sensor electrodes.

20. The display device of claim 19, wherein the first conductive layer further comprises a first connection electrode connecting adjacent first sensor electrodes, the second conductive layer further comprises a second connection electrode connecting adjacent second sensor electrodes, and the insulating layer is disposed between the first connection electrode and the second connection electrode.

* * * * *